US011137254B2

(12) United States Patent
Ito

(10) Patent No.: US 11,137,254 B2
(45) Date of Patent: Oct. 5, 2021

(54) MEMS DEVICE, INERTIAL MEASUREMENT UNIT, VEHICLE POSITIONING DEVICE, PORTABLE ELECTRONIC APPARATUS, ELECTRONIC APPARATUS, AND VEHICLE

(71) Applicant: Seiko Epson Corporation, Tokyo (JP)

(72) Inventor: Fumiya Ito, Koushoku (JP)

(73) Assignee: Seiko Epson Corporation

( * ) Notice: Subject to any disclaimer, the term of this patent is extended or adjusted under 35 U.S.C. 154(b) by 444 days.

(21) Appl. No.: 16/155,944

(22) Filed: Oct. 10, 2018

(65) Prior Publication Data

US 2019/0107397 A1   Apr. 11, 2019

(30) Foreign Application Priority Data

Oct. 11, 2017   (JP) .............................. JP2017-197435

(51) Int. Cl.
*G01C 21/16* (2006.01)
*G01C 19/5712* (2012.01)
(Continued)

(52) U.S. Cl.
CPC .......... *G01C 21/165* (2013.01); *B81B 3/0051* (2013.01); *G01C 19/5712* (2013.01); *G01C 21/20* (2013.01); *G01P 15/125* (2013.01); *G01P 15/18* (2013.01); *G01S 19/03* (2013.01); *G01S 19/49* (2013.01); *G05D 1/0891* (2013.01); *B81B 2201/025* (2013.01); *G01P 2015/0831* (2013.01); *G01P 2015/0871* (2013.01); *G05D 2201/0201* (2013.01); *G05D 2201/0213* (2013.01)

(58) Field of Classification Search
CPC ............ B81B 3/0051; B81B 2201/025; G01C 19/5712; G01C 21/165; G01C 21/20; G01P 15/125; G01P 15/18; G01P 2015/0831; G01P 2015/0871; G05D 1/0891; G05D 2201/0213; G05D 2201/0201; G01S 19/03; G01S 19/49
See application file for complete search history.

(56) References Cited

U.S. PATENT DOCUMENTS

2007/0021915 A1*  1/2007  Breed .................... G08G 1/164
                                                        701/301
2013/0329385 A1* 12/2013  Murayama ............... H05K 7/02
                                                        361/757

(Continued)

FOREIGN PATENT DOCUMENTS

JP       2014-089101 A     5/2014
JP       2014-181922 A     9/2014
(Continued)

*Primary Examiner* — Dao L Phan
(74) *Attorney, Agent, or Firm* — Harness, Dickey & Pierce, P.L.C.

(57) ABSTRACT

A MEMS device includes: a base (substrate) having a support part and a fixed electrode (detection electrode); a movable member supported on the support part with a main surface facing the fixed electrode; and a lid joined to the base and forming an accommodation space in which the movable member is accommodated. The lid has an abutting part which faces, via a space, at least a part of an outer edge of the movable member accommodated in the accommodation space and regulates displacement in an in-plane direction of the main surface.

19 Claims, 15 Drawing Sheets

(51) Int. Cl.
*G01C 21/20* (2006.01)
*G01S 19/03* (2010.01)
*G05D 1/08* (2006.01)
*G01S 19/49* (2010.01)
*G01P 15/18* (2013.01)
*B81B 3/00* (2006.01)
*G01P 15/125* (2006.01)
*G01P 15/08* (2006.01)

(56) References Cited

U.S. PATENT DOCUMENTS

2015/0013458 A1* 1/2015 Tanaka .................. B81B 3/0051
 73/514.35
2019/0064203 A1* 2/2019 Tanaka ...................... G01P 3/44

FOREIGN PATENT DOCUMENTS

| JP | 2015-007560 A | 1/2015 |
| JP | 2015-017886 A | 1/2015 |
| JP | 2015-152553 A | 8/2015 |

* cited by examiner

MEMS DEVICE, INERTIAL MEASUREMENT UNIT, VEHICLE POSITIONING DEVICE, PORTABLE ELECTRONIC APPARATUS, ELECTRONIC APPARATUS, AND VEHICLE

CROSS-REFERENCE TO RELATED APPLICATION

This nonprovisional application claims the benefit of Japanese Patent Application No. 2017-197435 filed Oct. 11, 2017, the entire disclosure which is incorporated herein by reference.

BACKGROUND

1. Technical Field

The present invention relates to a MEMS device, an inertial measurement unit, a vehicle positioning device, a portable electronic apparatus, an electronic apparatus, and a vehicle.

2. Related Art

According to the related art, as a physical quantity sensor for detecting a physical quantity such as acceleration, a MEMS (micro-electromechanical system) device is known which has a movable electrode as a movable member supported on a base by a support part in such a way as to be able to swing and a detection electrode as a fixed electrode arranged at a position facing the movable member via a space. In such a MEMS device, the movable electrode swings in response to a physical quantity such as acceleration applied to the MEMS device, thus changing the space between movable electrode and the detection electrode. The MEMS device detects the physical quantity such as acceleration applied to the MEMS device, based on a change in the electrostatic capacitance generated between the two electrodes according to the change in the space.

For example, JP-A-2015-17886 discloses a physical quantity sensor provided with an electrostatic MEMS device having a movable electrode and a fixed electrode with a space and thus spaced apart from the movable electrode. In this MEMS device, a stopper is provided on the base to regulate displacement of the movable electrode in a different direction from the direction of detecting the physical quantity.

However, in the foregoing physical quantity sensor, since the stopper is provided on the base, there is a large space (gap) between the movable electrode and the stopper provided on the base of the MEMS device due to restrictions in the manufacturing process. The large space between the movable electrode and the stopper may lead to excessive collision between the movable electrode and the stopper of the MEMS device when an excessive impact or the like is applied to the physical quantity sensor. This may result in damage to the movable electrode or damage to the stopper, causing a problem of not being able to detect a physical quantity normally.

SUMMARY

An advantage of some aspects of the invention is to solve at least a part of the problems described above, and the invention can be implemented as the following configurations or application examples.

Application Example 1

A MEMS device according to this application example includes: a base having a support part and a fixed electrode; a movable member supported on the support part with a main surface facing the fixed electrode; and a lid joined to the base and forming an accommodation space in which the movable member is accommodated. The lid has an abutting part which faces, via a space, at least a part of an outer edge of the movable member accommodated in the accommodation space and regulates displacement in an in-plane direction of the main surface.

In the MEMS device according to this application example, the lid is provided with the abutting part, which the movable member comes into contact with when the movable member is displaced in the in-plane direction. Providing the movable member and the abutting part as separate components can reduce the space (gap) between the movable member and the abutting part, compared with the integrated structure of the related art, where the movable member and the abutting part are integrated together. The impact of the displaced movable member coming into contact with the abutting part is proportional to the space between the movable member and the abutting part. Therefore, reducing the space between the movable member and the abutting part as in this example can reduce the impact of the movable member coming into contact with the abutting part for regulating displacement in the in-plane direction of the main surface. Such reduction in the impact on the movable member when coming into contact with the abutting part can reduce damage to the movable member and damage to the abutting part.

Application Example 2

In the MEMS device according to the application example, it is preferable that the abutting part is provided facing the outer edge of the movable member situated at least in one of a first direction which forms the main surface of the movable member and a second direction which intersects the first direction.

According to this application example, the displacement of the movable member in the first direction and the second direction can be securely regulated.

Application Example 3

In the MEMS device according to the application example, it is preferable that the abutting part is provided facing a corner part of the movable member.

According to this application example, the abutting part is provided facing the corner part, which largely fluctuates in response to rotational displacement of the movable member. Thus, when the movable member is displaced in an in-plane rotational direction, the displacement can be securely regulated.

Application Example 4

In the MEMS device according to the application example, it is preferable that the abutting part is provided in the shape of a frame along the outer edge of the movable member.

According to this application example, the probability of the abutting part as a stopper regulating the displacement of the movable member in the in-plane direction or in the in-plane rotational direction can be increased.

Application Example 5

In the MEMS device according to the application example, it is preferable that the abutting part is provided in a plural number.

According to this application example, the abutting part, which the movable member comes into contact with, is arranged in a plural number. Thus, the probability of the abutting parts as a stopper regulating the displacement of the movable member in the in-plane direction can be increased.

Application Example 6

In the MEMS device according to the application example, it is preferable that the abutting part is formed integrally with the lid.

According to this application example, the lid and the abutting part can be easily formed by the same manufacturing process.

Application Example 7

In the MEMS device according to the application example, it is preferable that the lid has a recessed part forming the accommodation space and that the abutting part protrudes into the recessed part from the lid.

According to this application example, the abutting part is provided, protruding into the recessed part from the lid. Thus, the abutting part can be arranged with high spatial efficiency and the abutting part can be formed easily.

Application Example 8

In the MEMS device according to the application example, it is preferable that the movable member is provided with a cavity part, that a fixed part and a suspension part extending from the fixed part are provided in the cavity part, where the movable member is viewed in a plan view, and that the movable member is suspended via the suspension part on the fixed part fixed to the support part.

According to this application example, the movable member is suspended on the support part by the fixed part via the suspension part. Thus, the suspension part can function as a torsion spring and can displace the movable member in the direction of the axis of rotation of a support shaft.

Application Example 9

In the MEMS device according to the application example, it is preferable that the movable member and the abutting part are made of a same material.

According to this application example, the movable member and the abutting part are less likely to stick to each other when coming into contact with each other.

Application Example 10

In the MEMS device according to the application example, it is preferable that the abutting part and the movable member have a same electric potential.

According to this application example, the movable member and the abutting part have the same electric potential. This configuration can restrain fluctuation or loss of electrostatic capacitance generated between the movable member and the abutting part when these two components come into contact with each other. Thus, a physical quantity such as acceleration can be measured continuously when the movable member and the abutting part come into contact with each other.

Application Example 11

An inertial measurement unit according to this application example includes: the MEMS device according to one of the foregoing application examples; and a control circuit which controls driving of the MEMS device.

The inertial measurement unit according to this application example can achieve the effects of the MEMS device as described above. Thus, a highly reliable inertial measurement unit can be provided.

Application Example 12

A vehicle positioning device according to this application example includes: the inertial measurement unit according to the foregoing application example; a receiving unit which receives a satellite signal with location information superimposed thereon, from a positioning satellite; an acquisition unit which acquires location information of the receiving unit, based on the received satellite signal; a computing unit which computes an attitude of a vehicle, based on inertial data outputted from the inertial measurement unit; and a calculating unit which corrects the location information, based on the calculated attitude, and thus calculates a location of the vehicle.

The vehicle positioning device according to this application example can achieve the effects of the MEMS device as described above. Thus, a highly reliable vehicle positioning device can be provided.

Application Example 13

A portable electronic apparatus according to this application example includes: the MEMS device according to one of the foregoing application examples; a case which accommodates the MEMS device; a processing unit which is accommodated in the case and processes output data from the MEMS device; a display unit accommodated in the case; and a light-transmissive cover which closes an opening of the case.

The portable electronic apparatus according to this application example can achieve the effects of the MEMS device as described above. Thus, a highly reliable portable electronic apparatus can be provided.

Application Example 14

An electronic apparatus according to this application example includes: the MEMS device according to one of the foregoing application examples; and a control unit which performs control based on a detection signal outputted from the MEMS device.

Such an electronic apparatus can achieve the effects of the MEMS device as described above. Thus, a highly reliable electronic apparatus can be provided.

Application Example 15

A vehicle according to this application example includes: the MEMS device according to one of the foregoing application examples; and an attitude control unit which controls attitude, based on a detection signal outputted from the MEMS device.

Such a vehicle can achieve the effects of the MEMS device as described above. Thus, a highly reliable vehicle can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the drawings. In the illustrations below, the dimensions and proportions of individual components may be different from the actual dimensions and proportions of the components, so that the components are large enough to be recognized in the illustrations.

Embodiments

Figure 1:
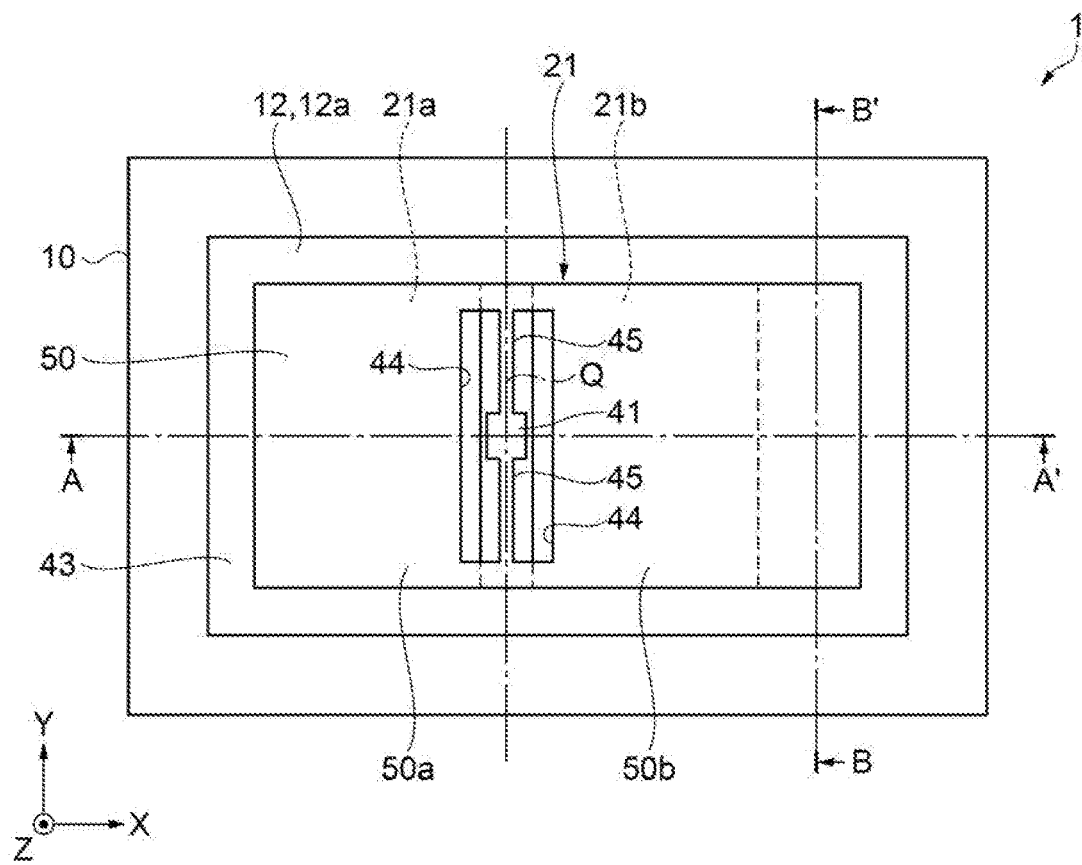
FIG. 1 is a plan view schematically showing a MEMS device according to a first embodiment.
Figure 2:
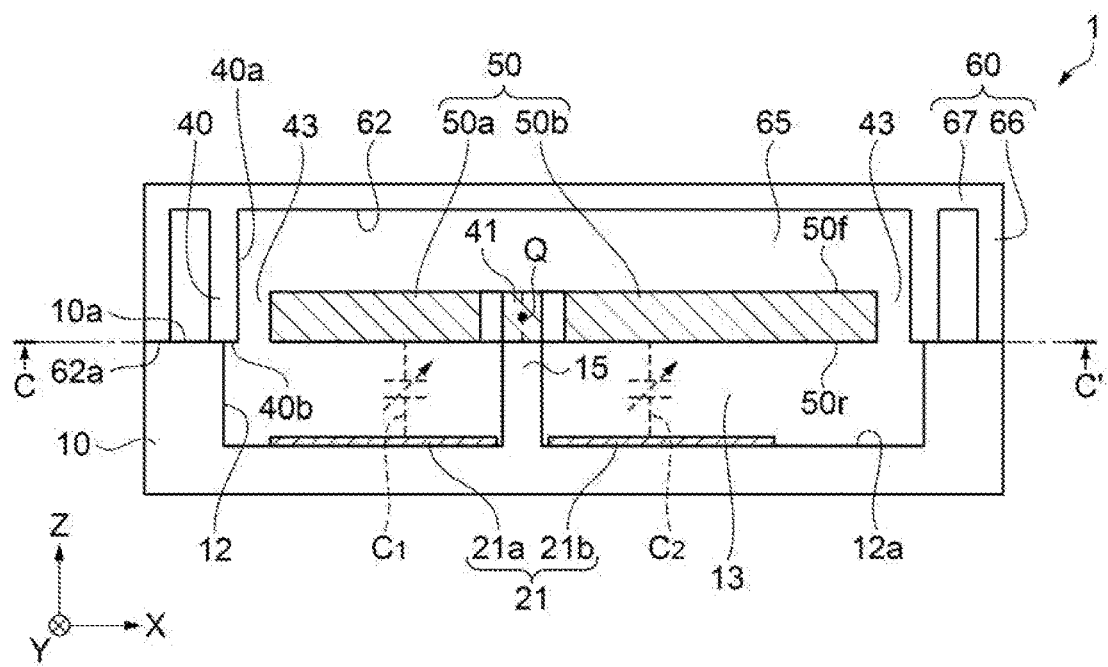
FIG. 2 is a cross-sectional view schematically showing the MEMS device according to the first embodiment, taken along A-A' in FIG. 1.
Figure 3:
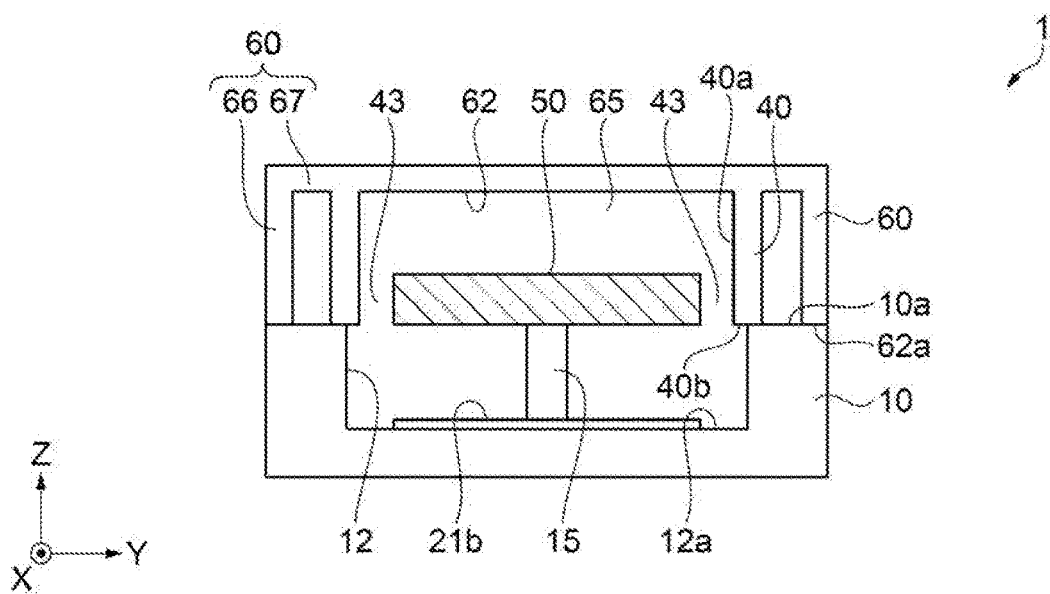
FIG. 3 is a cross-sectional view schematically showing the MEMS device according to the first embodiment, taken along B-B' in FIG. 1.
Figure 4:
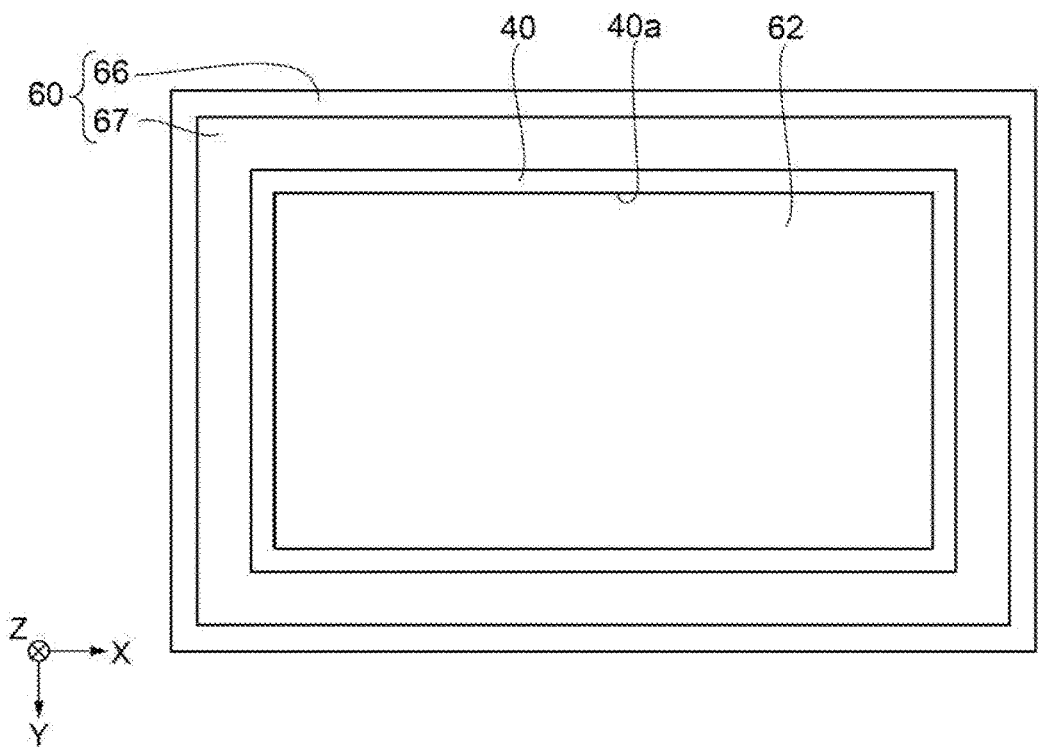
FIG. 4 is a plan view schematically showing a lid of the MEMS device according to the first embodiment and showing a plane at the position of C-C' in FIG. 2, as viewed from the substrate side.

A MEMS device (micro-electromechanical system) device according to an embodiment will be described with reference to FIGS. 1 to 4. FIG. 1 is a plan view schematically showing the MEMS device according to the embodiment. FIG. 2 is a cross-sectional view schematically showing a cross section of the MEMS device, taken along A-A' in FIG. 1. FIG. 3 is a cross-sectional view schematically showing a cross section of the MEMS device, taken along B-B' in FIG. 1. FIG. 4 is a plan view schematically showing a lid of the MEMS device according to the first embodiment and showing a plane at the position of C-C' in FIG. 2, as viewed from the substrate side. For the sake of convenience of the description, wiring parts or the like connected to individual electrodes are not shown in the illustrations. In FIG. 1, the lid is not shown. In FIG. 4, a movable member is not shown. In the illustrations, X-axis, Y-axis, and Z-axis are shown as three axes orthogonal to each other. The Z-axis is an axis indicating a direction of thickness in which a substrate and the lid overlap each other. The X-axis is an axis along a direction in which two detection electrodes provided on the substrate are arrayed. Also, for the sake of convenience of the description, as viewed in a plan view from the Z-axis direction, a surface on the +Z-axis direction, which is the lid side, may be referred to as an upper surface, and a surface on the −Z-axis direction on the opposite side may be referred to as a lower surface.

First Embodiment

Structure of MEMS Device

A MEMS device 1 according to the first embodiment can be used, for example, as an inertial sensor. Specifically, the MEMS device 1 can be used as a sensor for measuring a physical quantity of acceleration in the vertical direction (Z-axis direction) (electrostatic MEMS (micro-electromechanical system) acceleration sensor).

As shown in FIGS. 1 to 4, the MEMS device 1 has a substrate 10 as a base, a detection electrode 21 as a fixed electrode on the substrate 10, and a movable member 50 having a space from the detection electrode 21 and supported on a support part 15 via a suspension part 45. In the MEMS device 1, a lid 60 covering the movable member 50 and the like is joined to the substrate 10.

The substrate 10 as a base is a base member on which the detection electrode 21 or the like is provided. The substrate 10 is provided with a first depressed part 12 on the side to which the lid 60 is joined. As viewed from the Z-axis direction, which is a direction perpendicular to the substrate 10, the movable member 50 and the detection electrode 21 are enclosed in the first depressed part 12. The detection electrode 21 is provided on a first bottom surface 12a of the first depressed part 12.

As the material of the substrate 10, an insulative material can be used. In the MEMS device 1 in this embodiment, the substrate 10 uses a base material including borosilicate glass. In the description below, one surface of the substrate 10 where the first depressed part 12 is provided and where the lid 60, described later, is connected, is referred to as an upper surface 10a.

The detection electrode 21 as a fixed electrode is provided on the first bottom surface 12a in such a way as to at least partly overlap the movable member 50 and via a space 13 from the movable member 50, as viewed in a plan view from the Z-axis direction, which is a direction perpendicular to the first bottom surface 12a of the substrate 10. The detection electrode 21 includes a first detection electrode 21a and a second detection electrode 21b. The first detection electrode 21a and the second detection electrode 21b are electrically insulated from each other.

The detection electrode 21 is provided on the first bottom surface 12a, on both sides of a support axis Q about which the movable member 50 tilts, as viewed in a plan view from the Z-axis direction, which is a direction perpendicular to the first bottom surface 12a. On the first bottom surface 12a, the first detection electrode 21a is provided on one side of the support axis Q and the second detection electrode 21b is provided on the other side of the support axis Q. The support axis Q is an imaginary line extending in the direction in which the suspension part 45 extends.

The detection electrode 21 includes the first detection electrode 21a provided in the −X-axis direction from the support axis Q shown in FIG. 1 and in such a way as to partly overlap a first movable member 50a (movable member 50), described later. The detection electrode 21 also includes the second detection electrode 21b provided in the +X-axis direction from the support axis Q shown in FIG. 1 and in such a way as to partly overlap a second movable member 50b (movable member 50), described later. It is preferable that the first detection electrode 21a and the second detection electrode 21b have the same surface area. It is also preferable that the area over which the first movable member 50a and the first detection electrode 21a overlap each other and the area over which the second movable member 50b and the second detection electrode 21b overlap each other are equal. This is for the purpose of detecting the magnitude and direction of a physical quantity such as acceleration applied to the MEMS device 1, based on a difference in electrostatic capacitance generated between the first movable member 50a and the second movable member 50b, and the first detection electrode 21a and the second detection electrode 21b.

As the material of the detection electrode 21, an electrically conductive material can be used. In the MEMS device 1 in this embodiment, the detection electrode 21 can use an electrically conductive material including, for example, gold (Au), copper (Cu), aluminum (Al), indium (I), titanium (Ti), platinum (Pt), tungsten (W), tin (Sn), silicon (Si) or the like.

The movable member 50 is provided on the first bottom surface 12a, with the space 13 from the detection electrode 21. The movable member 50 is supported on the support part 15 connected to the first bottom surface 12a, by a fixed part 41 via the suspension part 45.

The movable member 50 includes the first movable member 50a and the second movable member 50b on both side of the support axis Q. The movable member 50 is supported on the support part 15 by the fixed part 41 via the suspension part 45 and therefore can be provided having the space 13 from the detection electrode 21. The movable member 50 is spaced apart from the detection electrode 21 by the space 13 and therefore can tilt (seesaw) about the suspension part 45 as the support axis Q, toward and away from the first bottom surface 12a, where the detection electrode 21 is provided. The surface of the movable member 50 facing the detection electrode 21 is referred to as a main surface 50r. The surface opposite to the main surface 50r is referred to as a main surface 50f of the movable member 50.

As the movable member 50 seesaws about the suspension part 45 as the support axis Q, the space 13 (distance) between each of the first movable member 50a and the second movable member 50b and the detection electrode 21 changes. According to the change in the space 13 between the movable member 50 and the detection electrode 21, the electrostatic capacitance generated between the movable member 50 and the detection electrode 21 can be changed.

When an acceleration in the vertical direction (for example, a gravitational acceleration) is applied to the movable member 50, a moment of rotation (moment of force) is generated in each of the first movable member 50a and the second movable member 50b. Here, if the moment of rotation in the first movable member 50a (for example, a moment of counterclockwise rotation) and the moment of rotation in the second movable member 50b (for example, a moment of clockwise rotation) are in equilibrium, the tilt of the movable member 50 does not change and the acceleration cannot be detected. Therefore, the movable member 50 is provided in such a way that when an acceleration in the vertical direction is applied, the moment of rotation in the first movable member 50a and the moment of rotation in the second movable member 50b are not in equilibrium, allowing the movable member 50 to tilt to a predetermined degree.

In the MEMS device 1, the support axis Q is arranged at a position off the center (center of gravity) of the movable member 50 (the distances from the support axis Q to the end surfaces in the X-axis direction of the first movable member 50a and the second movable member 50b are different). Thus, the first movable member 50a and the second movable member 50b have different masses from each other. That is, in the movable member 50, one side of the support axis Q (first movable member 50a) and the other side of the support axis Q (second movable member 50b) have different masses from each other. In the illustrated example, the distance from the support axis Q to the end surface of the first movable member 50a is shorter than the distance from the support axis Q to the end surface of the second movable member 50b. Also, the thickness of the first movable member 50a and the thickness of the second movable member 50b substantially equal to each other. Therefore, the mass of the first movable member 50a is smaller than the mass of the second movable member 50b. Since the first movable member 50a and the second movable member 50b have different masses from each other in this way, the moment of rotation in the first movable member 50a and the moment of rotation in the second movable member 50b can be prevented from being in equilibrium when an acceleration in the vertical direction is applied. Thus, the movable member 50 can tilt to a predetermined degree when an acceleration in the vertical direction is applied.

An electrostatic capacitance (variable electrostatic capacitance) is generated between the movable member 50 and the detection electrode 21. Specifically, an electrostatic capacitor C1 (variable electrostatic capacitor) is generated between the first movable member 50a and the first detection electrode 21a. An electrostatic capacitor (variable electrostatic capacitor) C2 is generated between the second movable member 50b and the second detection electrode 21b.

The electrostatic capacitances of the electrostatic capacitors C1, C2 change according to the space 13 (distance) between the detection electrode 21 and the movable member 50. For example, the electrostatic capacitors C1, C2 have substantially equal electrostatic capacitance values when the movable member 50 is parallel to the substrate 10. The space (distance) between the movable member 50 and the first detection electrode 21a and the space 13 (distance) between the movable member 50 and the second detection electrode 21b are equal to each other. Therefore, the electrostatic capacitors C1, C2 have equal electrostatic capacitance values.

Meanwhile, when the movable member 50 tilts about the support axis Q as a support point, the electrostatic capacitance values of the electrostatic capacitors C1, C2 change according to the tilt of the movable member 50. The space 13 (distance) between the movable member 50 and the first detection electrode 21a and the space 13 (distance) between the movable member 50 and the second detection electrode 21b are different from each other according to the tilt of the movable member 50. Therefore, the electrostatic capacitance values of the electrostatic capacitors C1, C2 are different from each other according to the space 13 (distance).

The fixed part 41 is provided inside a penetration part 44 as a cavity part provided between the first movable member 50a and the second movable member 50b, when the movable member 50 is viewed in a plan view. The fixed part 41 is connected to the movable member 50 by two suspension parts 45 extending on both side from the fixed part 41. In other words, lateral surface connecting the upper surface and the lower surface of the fixed part 41 and the suspension parts 45 face the penetration part 44. The suspension parts 45 are provided as the support axis Q about which the movable member 50 tilts. The suspension parts 45 can also function as a torsion spring and can twist in the direction of the axis of rotation of the support axis Q. The fixed part 41 is fixed to the support part 15 protruding from the first bottom surface 12a of the substrate 10.

As the suspension parts 45 function as a torsion spring as described above, the movable member 50 can tilt (seesaw) according to a physical quantity such as acceleration. The suspension parts 45 have toughness against "torsional deformation" generated by the tilt of the movable member 50. Thus, damage to the suspension parts 45 can be restrained.

The movable member 50 has a space 43 between the lid 60 and the movable member 50, and the space 13 between the detection electrode 21 and the movable member 50 and therefore can seesaw about the suspension parts 45 as the support axis Q.

In the MEMS device 1 in this embodiment, the fixed part 41, the suspension parts 45, and the movable member 50 can be provided as one unit by patterning a single base material. It is preferable that the movable member 50 uses an electrically conductive material. This is for the movable member 50 to function as an electrode. Also, to form the movable member 50, the fixed part 41, and the suspension parts 45 as one unit, for example, it is preferable to use a base material including silicon, which can be easily processed by photolithography.

The fixed part 41, the suspension parts 45, and the movable member 50 can also use an insulative material. To form the movable member 50 with an insulative material, an electrode film may be provided on the surface of the movable member 50 facing the detection electrode 21. Thus, an electrostatic capacitance is generated between the detection electrode 21 and the movable member 50, and the electrostatic capacitance can change according to a change in the space 13 between the detection electrode 21 and the movable member 50 due to a tilt of the movable member 50 caused by a physical quantity such as acceleration.

The lid 60 is provided, connected to the substrate 10. The lid 60 includes a top plate part 67 which is a top plate portion, an outer peripheral part 66 protruding from an outer peripheral edge of the top plate part 67, and an abutting part 40 situated to the inner side of the outer peripheral part 66, facing the outer peripheral part 66 via a space, and protruding from the top plate part 67. The lid 60 is provided with a second depressed part 62 as a recessed part formed by the top plate part 67 and the outer peripheral part 66.

It is preferable that the abutting part 40 is provided facing an outer edge of the movable member 50 situated at least in one of the X-axis direction (first direction) and the Y-axis direction (second direction intersecting the first direction), which are directions (in-plane directions) forming the main surfaces 50f, 50r of the movable member 50. Such an arrangement of the abutting part 40 makes it possible to securely regulate displacement of the movable member 50 in the X-axis direction (first direction) and the Y-axis direction, which are in-plane directions of the main surfaces 50f, 50r of the movable member 50.

The abutting part 40 in this embodiment is provided in the shape of a frame along the outer peripheral part 66, within the second depressed part 62 as a recessed part. The abutting part 40 includes an inner surface 40a protruding into the second depressed part 62 from the top plate part 67 and situated on the side opposite to the outer peripheral part 66, and an end surface 40b situated on the same plane as a joining surface 62a which is an open end surface of the outer peripheral part 66. In this case, the inner surface 40a functions as an abutting surface to the movable member 50. Providing the abutting part 40 protruding into the second depressed part 62 from the top plate part 67 makes it possible to arrange the abutting part 40 with high spatial efficiency and to easily form the abutting part 40.

The abutting part 40 is provided as a stopper for regulating displacement of the movable member 50 in the X-axis and Y-axis directions (in-plane direction of the movable member 50) intersecting the Z-axis direction or rotational displacement of the movable member 50 in the in-plane direction of the main surfaces 50f, 50r of the movable member 50 about the Z-axis as the axis of rotation, without preventing the movable member 50 from tilting in the Z-axis direction due to a physical quantity such as acceleration applied to the MEMS device 1. Providing the abutting part 40 in the shape of a frame along the outer peripheral part 66 can increase the probability of the abutting part 40 as a stopper regulating displacement of the movable member 50 in the in-plane direction or displacement of the movable member 50 in the in-plane rotational direction. However, the arrangement of the abutting part 40 is not particularly limited and can be provided along the outer edge of the movable member 50 in a direction in which displacement of the movable member 50 is to be regulated.

It is preferable that the abutting part 40 is formed integrally with the lid 60. Forming the abutting part 40 integrally with the lid 60 makes it possible to easily form the lid 60 and the abutting part 40 in the same manufacturing process.

The lid 60 is connected to the upper surface 10a of the substrate 10, at the joining surface 62a, which is the top surface (end surface at the open end of the outer peripheral part 66) of the second depressed part 62. In this case, the lid 60 is connected in such a way that the space 43 is provided between the inner surface 40a of the abutting part 40 and the movable member 50. The end surface 40b of the abutting part 40 may or may not be joined to the upper surface 10a of the substrate 10. It is also preferable that the inner surface 40a of the abutting part 40 is situated to the inner side from the inner edge of the upper surface 10a of the substrate 10. Situating the inner surface 40a in this way enables the abutting part 40 to effectively function as a stopper for regulating displacement of the movable member 50.

As the lid 60 is connected to the substrate 10, a cavity 65 as an accommodation space surrounded by the first depressed part 12 provided on the substrate 10 and the second depressed part 62 provided on the lid 60 is formed. The movable member 50 or the like is accommodated in the cavity 65 formed by the substrate 10 and the lid 60. Thus, the movable member 50 or the like can be protected from external disturbances to the MEMS device 1.

It is preferable that the second depressed part 62 is provided with such a depth that the movable member 50 and the lid 60 do not come into contact with each other when the movable member 50 tilts in the Z-axis direction, in which the substrate 10 and the lid 60 are connected together. It is also preferable that the second depressed part 62 is provided with a depth that is greater than the thickness of the movable member 50 at least in the Z-axis direction, in which the movable member 50 tilts. The lid 60 is grounded via a wiring, not illustrated.

It is preferable that the abutting part 40 of the lid 60 has the space 43 that is as small as possible within such a range that the movable member 50 and the inner surface 40a of the abutting part 40 do not come into contact with each other when the movable member 50 tilts in the Z-axis direction. In this way, the abutting part 40, which the movable member 50 comes into contact with when being displaced in the in-plane direction, is provided in the lid 60, and the movable member 50 and the abutting part 40 are provided as separate components. Thus, the space 43 between the movable member 50 and the abutting part 40 can be made smaller than in the related-art integrated structure, where the movable member and the abutting part are integrally formed. The impact of the displaced movable member 50 coming into contact with the abutting part 40 is proportional to the space between the movable member 50 and the abutting part 40. Therefore, having the smaller space 43 between the movable member 50 and the abutting part 40 as in this example can reduce the impact of the movable member 50 coming into contact with the abutting part 40 regulating displacement in the in-plane direction of the main surfaces 50f, 50r.

It is preferable that the lid 60 uses an electrically conductive material. The lid 60 in this embodiment uses, for example, the same base material as the movable member 50 containing silicon, which is easy to process. Since the lid 60 uses the base material containing silicon, the lid 60 can be connected (joined) to the substrate 10 using borosilicate glass by glass frit bonding. Also, this configuration makes the movable member 50 and the abutting part 40 less likely to stick to each other when coming into contact with each other.

It is preferable that the abutting part 40 has the same electric potential as the movable member 50. The abutting part 40 can have the same electric potential as the movable member 50 by using an electrically conductive material. As the abutting part 40 and the movable member 50 have the same electric potential, fluctuation or loss of electrostatic capacitance generated between the movable member 50 and the abutting part 40 can be restrained when the movable member 50 and the abutting part 40 come into contact with each other. Thus, a physical quantity such as acceleration can be measured continuously when the movable member 50 and the abutting part 40 come into contact with each other.

In the MEMS device 1, a wiring part (not illustrated) for taking out the electrostatic capacitances (C1, C2) generated between the detection electrode 21 and the movable member 50 as electrical signals is provided. Via the wiring part, the electrostatic capacitances generated according to the tilt of the movable member 50 can be outputted outside the MEMS device 1.

Operations of MEMS Device 1

Figure 5A:
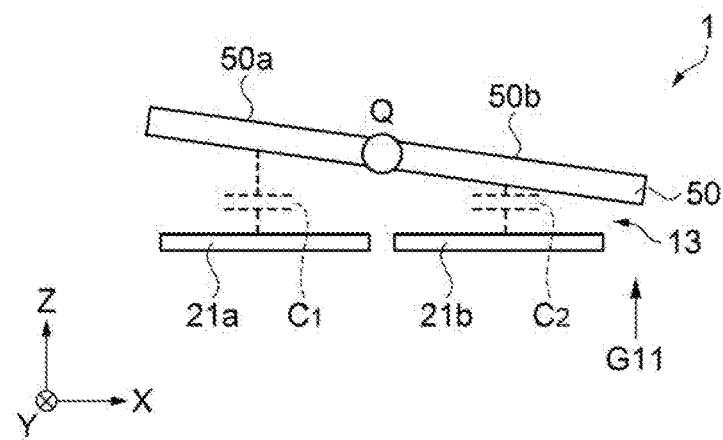
FIG. 5A is a schematic view for explaining operations of the MEMS device.
Figure 5B:
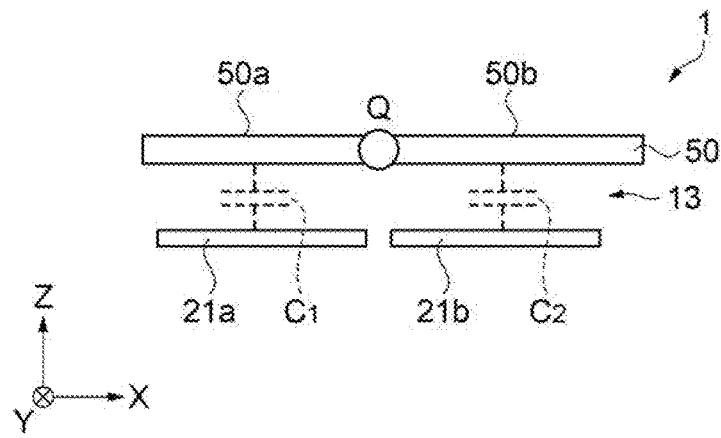
FIG. 5B is a schematic view for explaining operations of the MEMS device.
Figure 5C:
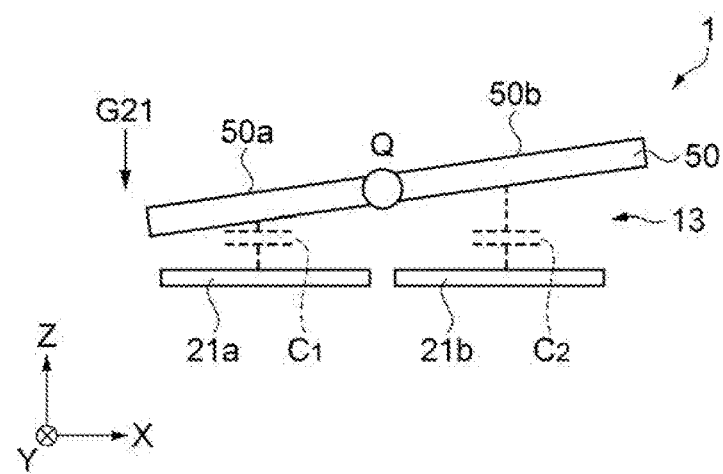
FIG. 5C is a schematic view for explaining operations of the MEMS device.

Operations of the MEMS device 1 in this embodiment will be described with reference to FIGS. 5A to 5C. FIGS. 5A, 5B, and 5C are schematic views for explaining operations of the MEMS device according to the embodiment. In FIGS. 5A, 5B, and 5C, parts other than the movable member and the detection electrode are not shown. Also, in FIGS. 5A, 5B, and 5C, configurations other than those of the detection electrode 21 and the movable member 50 are not shown. In the MEMS device 1 shown in FIGS. 5A, 5B, and 5C, a moment of rotation (moment of force) about the support axis Q is generated in the movable member 50, for example, when an acceleration (for example, gravitational acceleration) in the Z-axis direction is applied.

FIG. 5A shows the state where an acceleration G11 acting on the MEMS device 1 from the −Z-axis direction to the +Z-axis direction is applied to the movable member 50. In this state, the acceleration acts more greatly on the second movable member 50b side than on the first movable member 50a side of the movable member 50. Therefore, a clockwise force about the support axis Q as the axis of rotation acts on the movable member 50. This causes the movable member 50 (second movable member 50b) to tilt toward the second detection electrode 21b about the support axis Q as the axis of rotation.

Thus, the space 13 between the second movable member 50b and the second detection electrode 21b becomes smaller (shorter), thus increasing the electrostatic capacitance value of the electrostatic capacitor C2 between the second movable member 50b and the second detection electrode 21b. Meanwhile, the space 13 between the first movable member 50a and the first detection electrode 21a becomes larger (longer), thus decreasing the electrostatic capacitance value of the electrostatic capacitor C1 between the first movable member 50a and the first detection electrode 21a.

FIG. 5B shows the state where no acceleration is applied to the MEMS device 1. In this state, the acceleration G11 is applied neither on the first movable member 50a side nor on the second movable member 50b side and therefore no force acts on the movable member 50. Thus, the movable member 50 does not tilt in any direction. That is, the movable member 50 is substantially parallel to the substrate 10.

Thus, the space 13 between the first movable member 50a and the first detection electrode 21a and the space 13 between the second movable member 50b and the second detection electrode 21b are substantially equal. Therefore, the electrostatic capacitance values of the electrostatic capacitor C1 between the first movable member 50a and the first detection electrode 21a and the electrostatic capacitor C2 between the second movable member 50b and the second detection electrode 21b are substantially equal. The space 13 between the first movable member 50a and the first detection electrode 21a is smaller and the electrostatic capacitance value of the electrostatic capacitor C1 generated between these is greater than in the state of the MEMS device 1 shown in FIG. 5A. Meanwhile, the space 13 between the second movable member 50b and the second detection electrode 21b is larger and the electrostatic capacitance value of the electrostatic capacitor C2 generated between these is smaller.

FIG. 5C shows the state where an acceleration G21 acting on the MEMS device 1 from the +Z-axis direction to the −Z-axis direction is applied to the movable member 50. In this state, the acceleration G21 acts on the first movable member 50a side of the movable member 50. Therefore, a counterclockwise force about the support axis Q as the axis of rotation acts on the movable member 50. This causes the movable member 50 to tilt toward the first detection electrode 21a. FIG. 5C shows the state where the acceleration G21 is greater than the gravitational acceleration acting on the second movable member 50b. Therefore, the movable member 50 to tilt toward the first detection electrode 21a.

Thus, the space 13 between the first movable member 50a and the first detection electrode 21a becomes smaller (shorter), thus increasing the electrostatic capacitance value of the electrostatic capacitor C1 between the first movable member 50a and the first detection electrode 21a. Meanwhile, the space 13 between the second movable member 50b and the second detection electrode 21b becomes larger (longer), thus decreasing the electrostatic capacitance value of the electrostatic capacitor C2 between the second movable member 50b and the second detection electrode 21b. The space 13 between the first movable member 50a and the first detection electrode 21a is smaller and the electrostatic capacitance value of the electrostatic capacitor C1 generated between these is greater than in the state in which an acceleration is not applied to the MEMS device 1 shown in FIG. 5B. Meanwhile, the space 13 between the second movable member 50b and the second detection electrode 21b is larger and the electrostatic capacitance value of the electrostatic capacitor C2 generated between these is smaller.

The MEMS device 1 in this embodiment can detect the value of an acceleration (for example, G11, G21), based on changes in the two electrostatic capacitance values. For example, by determining changes in the capacitance values in the state of FIG. 5A with reference to the capacitance values obtained in the state of FIG. 5B, it is possible to detect the direction in which the acceleration G11 acts and its force. By determining changes in the capacitance values in the state of FIG. 5C, it is possible to detect the direction in which the acceleration G21 acts and its force.

In the MEMS device 1 according to the first embodiment, the lid 60 is provided with the abutting part 40 as a stopper with which the movable member 50 comes into contact when the movable member 50 is displaced in the in-plane direction of the main surfaces 50f, 50r. Proving the movable member 50 and the abutting part 40 as separate components in this way can make the space (gap) 43 between the movable member 50 and the abutting part 40 smaller than in the related-art integrated structure, where the stopper (abutting part) and the movable member are integrally formed. The impact of the displaced movable member 50 coming into contact with the abutting part 40 is proportional to the space (width of the space 43) between the movable member 50 and the abutting part 40. Therefore, having the smaller space 43 between the movable member 50 and the abutting part 40 as in this embodiment can reduce the impact of the movable member 50 coming into contact with the abutting part 40. Such reduction in the impact on the movable member 50 when coming into contact with the abutting part 40 can reduce damage to the movable member 50 and damage to the abutting part 40.

The abutting part 40 is provided facing the outer edge of the movable member 50 and in the shape of a frame (surrounding shape) along the outer edge. Therefore, displacement of the movable member 50 in the X-axis direction (first direction) and the Y-axis direction (second direction) forming the main surfaces 50f, 50r of the movable member 50 can be securely regulated.

Second Embodiment

Figure 6:
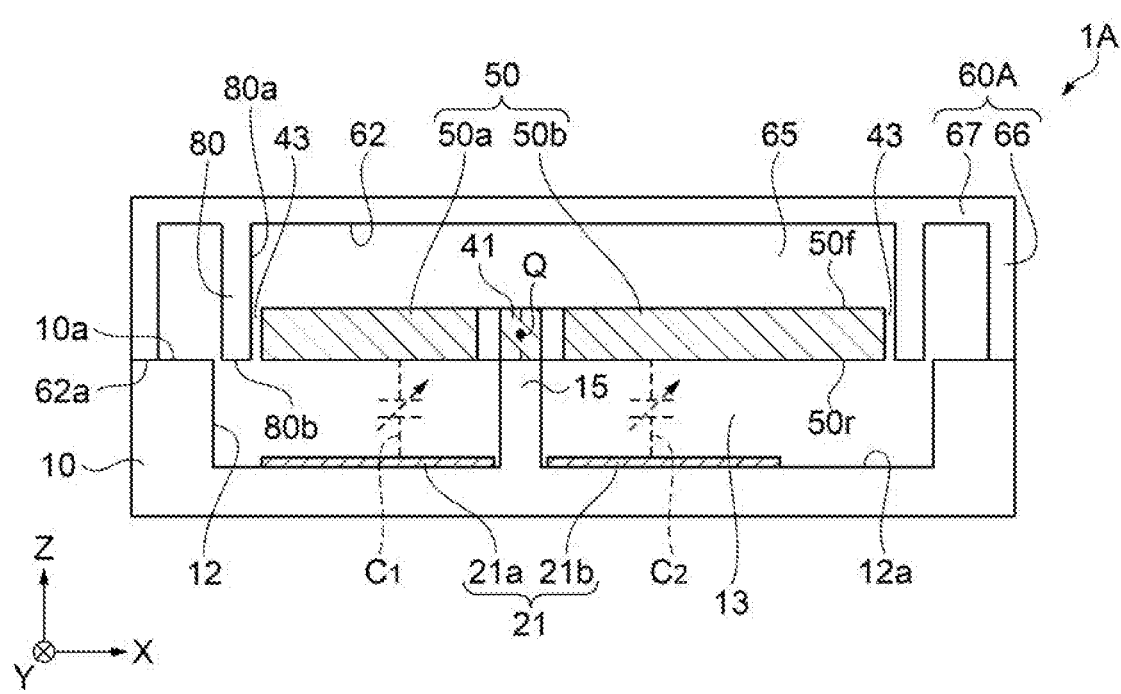
FIG. 6 is a cross-sectional view schematically showing a MEMS device according to a second embodiment, equivalent to the cross-sectional view taken along A-A' in FIG. 1.
Figure 7:
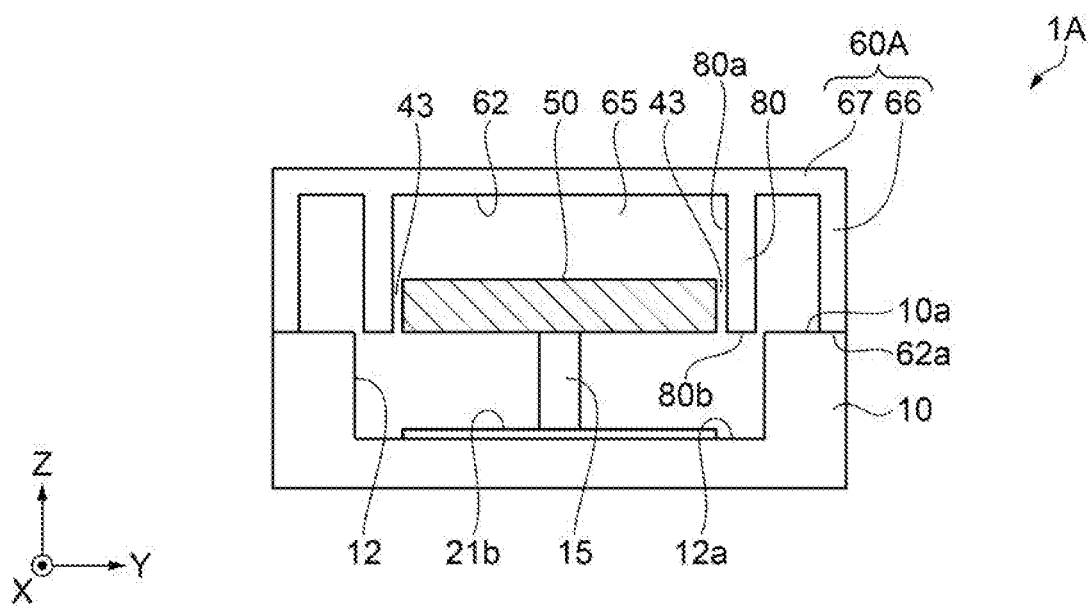
FIG. 7 is a cross-sectional view schematically showing the MEMS device according to the second embodiment, equivalent to the cross-sectional view taken along B-B' in FIG. 1.

Next, the configuration of a MEMS device according to a second embodiment will be described with reference to FIGS. 6 and 7. FIG. 6 is a cross-sectional view schematically showing the MEMS device according to the second embodiment, equivalent to the cross-sectional view taken along A-A' in FIG. 1. FIG. 7 is a cross-sectional view schematically showing the MEMS device according to the second embodiment, equivalent to the cross-sectional view taken along B-B' in FIG. 1. In the following description of the second embodiment, different components from those in the first embodiment are mainly described. Similar components are denoted by the same reference signs and not described further in detail. The MEMS device according to the second embodiment is different from the first embodiment in the configuration of the abutting part provided on the lid.

As shown in FIGS. 6 and 7, a MEMS device 1A according to the second embodiment is provided with a substrate 10 as a base, a detection electrode 21 as a fixed electrode on the substrate 10, and a movable member 50 supported on a support part 15 via a suspension part 45 and with a space from the detection electrode 21, as in the first embodiment. These components are similar to those in the first embodiment and therefore will not be described further in detail. In the MEMS device 1A, a lid 60A covering the movable member 50 and the like is joined to the substrate 10.

The lid 60A includes a top plate part 67, an outer peripheral part 66 protruding from an outer peripheral edge of the top plate part 67, and an abutting part 80 situated to the inner side of the outer peripheral part 66, facing the outer peripheral part 66 via a space, and protruding from the top plate part 67. The lid 60A is provided with a second depressed part 62 as a recessed part formed by the top plate part 67 and the outer peripheral part 66. The lid 60A is different from the lid of the first embodiment in the position where the abutting part 80 is arranged.

The lid 60A is connected to an upper surface 10a of the substrate 10 at a joining surface 62a, which is the top surface (end surface at the open end of the outer peripheral part 66) of the second depressed part 62. In this case, the lid 60A is connected in such a way that a space 43 is provided between an inner surface 80a of the abutting part 80 and the movable member 50.

As in the first embodiment, the abutting part 80 is provided facing an outer edge of the movable member 50 situated at least in one of the X-axis direction (first direction) and the Y-axis direction (second direction intersecting the first direction), which are directions (in-plane directions) forming main surfaces 50f, 50r of the movable member 50.

The abutting part 80 is provided in the shape of a frame along the outer peripheral part 66, within the second depressed part 62 as a recessed part. The abutting part 80 includes the inner surface 80a protruding into the second depressed part 62 from the top plate part 67 and situated on the side opposite to the outer peripheral part 66, and an end surface 80b situated on the same plane as the joining surface 62a, which is the open end surface of the outer peripheral part 66.

The end surface 80b of the abutting part 80 is arranged in such a way as to open into a first depressed part 12 provided on the substrate 10. In other words, in contrast to the first embodiment, the end surface 80b of the abutting part 80 is provided at a position not facing the upper surface 10a of the substrate 10.

The abutting part 80 is provided as a stopper for regulating displacement of the movable member 50 in the X-axis and Y-axis directions (in-plane direction of the movable member 50) intersecting the Z-axis direction or rotational displacement of the movable member 50 in the in-plane direction of the main surfaces 50f, 50r of the movable member 50 about the Z-axis as the axis of rotation, without preventing the movable member 50 from tilting in the Z-axis direction due to a physical quantity such as acceleration applied to the MEMS device LA. Providing the abutting part 80 in the shape of a frame along the outer peripheral part 66 can increase the probability of the abutting part 80 as a stopper regulating displacement of the movable member 50 in the in-plane direction. However, the arrangement of the abutting part 80 is not particularly limited and can be provided along the outer edge of the movable member 50 in a direction in which displacement of the movable member 50 is to be regulated.

It is preferable that the abutting part 80 is formed integrally with the lid 60A. Forming the abutting part 80 integrally with the lid 60A makes it possible to easily form the lid 60A and the abutting part 80 in the same manufacturing process.

The MEMS device 1A according to the second embodiment has the abutting part 80, in which the end surface 80b as an open end is arranged in the first depressed part 12. Therefore, the MEMS device 1A can achieve effects similar to those of the first embodiment. That is, the impact on the movable member 50 coming into contact with the abutting part 80 can be reduced. Therefore, damage to the movable member 50 and damage to the abutting part 80 can be reduced.

Third Embodiment

Figure 8:
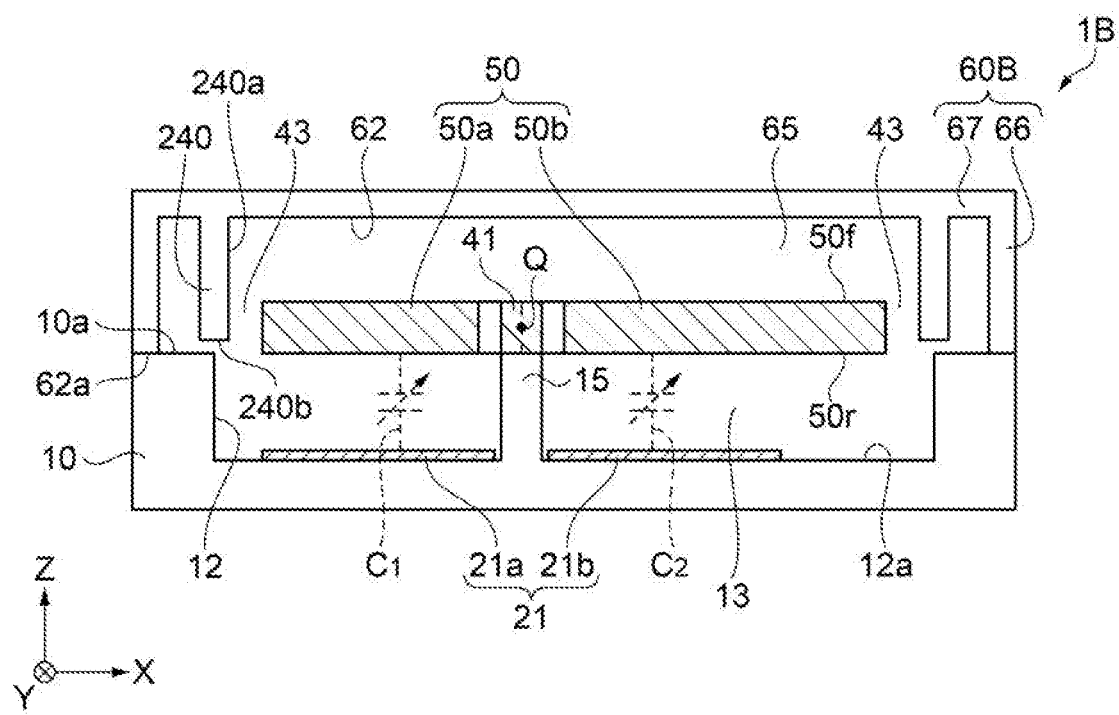
FIG. 8 is a cross-sectional view schematically showing a MEMS device according to a third embodiment, equivalent to the cross-sectional view taken along A-A' in FIG. 1.

Next, the configuration of a MEMS device according to a third embodiment will be described with reference to FIG. 8. FIG. 8 is a cross-sectional view schematically showing the MEMS device according to the third embodiment, equivalent to the cross-sectional view taken along A-A' in FIG. 1. In the following description of the third embodiment, different components from those in the first embodiment are mainly described. Similar components are denoted by the same reference signs and not described further in detail. The MEMS device according to the third embodiment is different from the first embodiment in the configuration of the abutting part provided on the lid.

As shown in FIG. 8, a MEMS device 1B according to the third embodiment is provided with a substrate 10 as a base, a detection electrode 21 as a fixed electrode on the substrate 10, and a movable member 50 supported on a support part 15 via a suspension part 45 and with a space from the detection electrode 21, as in the first embodiment. These components are similar to those in the first embodiment and therefore will not be described further in detail. In the MEMS device 1B, a lid 60B covering the movable member 50 and the like is joined to the substrate 10.

The lid 60B includes a top plate part 67, an outer peripheral part 66 protruding from an outer peripheral edge of the top plate part 67, and an abutting part 240 situated to the inner side of the outer peripheral part 66, facing the outer peripheral part 66 via a space, and protruding from the top plate part 67. The lid 60B is provided with a second depressed part 62 as a recessed part formed by the top plate part 67 and the outer peripheral part 66. The lid 60B is different from the lid of the first embodiment in the configuration of the abutting part 240.

The lid 60B is connected to an upper surface 10a of the substrate 10 at a joining surface 62a, which is the top surface (end surface at the open end of the outer peripheral part 66) of the second depressed part 62. In this case, the lid 60B is connected in such a way that a space 43 is provided between an inner surface 240a of the abutting part 240 and the movable member 50.

As in the first embodiment, the abutting part 80 is provided facing an outer edge of the movable member 50 situated at least in one of the X-axis direction (first direction) and the Y-axis direction (second direction intersecting the first direction), which are directions (in-plane directions) forming main surfaces 50f, 50r of the movable member 50. The abutting part 240 is provided in the shape of a frame along the outer peripheral part 66, within the second depressed part 62 as a recessed part. The abutting part 240 includes the inner surface 240a protruding into the second depressed part 62 from the top plate part 67 and situated on the side opposite to the outer peripheral part 66, and an end surface 240b situated close to the top plate part 67 than the joining surface 62a, which is the open end surface of the outer peripheral part 66. In other words, the end surface 240b of the abutting part 240 is provided at a position facing the upper surface 10a of the substrate 10 via a space.

The abutting part 240 is provided as a stopper for regulating displacement of the movable member 50, as in the first embodiment. The function of the stopper is similar to that in the first embodiment and therefore not described further in detail. The arrangement of the abutting part 240 is not particularly limited and can be provided along the outer edge of the movable member 50 in a direction in which displacement of the movable member 50 is to be regulated.

It is preferable that the abutting part 240 is formed integrally with the lid 60B. Forming the abutting part 240 integrally with the lid 60B makes it possible to easily form the lid 60B and the abutting part 240 in the same manufacturing process.

The MEMS device 1B according to the third embodiment has the abutting part 240, in which the end surface 240b is provided at a position facing the upper surface 10a of the substrate 10 via a space. Therefore, the MEMS device 1B can achieve effects similar to those of the first embodiment. That is, the impact on the movable member 50 coming into contact with the abutting part 240 can be reduced. Therefore, damage to the movable member 50 and damage to the abutting part 240 can be reduced.

Modifications of Abutting Part

In the embodiments, the abutting parts 40, 80, 240 provided on the lid 60 in the shape of a frame (surrounding shape) along the outer edge of the movable member 50 are described as examples. However, the configuration of the abutting part is not limited to these examples. Configurations as in the following modifications can also be employed. The configurations in modifications 1 to 3 will now be described in order with reference to FIGS. 9 to 11. In modifications 1 to 3, the abutting parts 40, 80, 240 in the form of a frame (surrounding shape) described in the embodiments are partly eliminated and thus divided into a plurality of abutting parts. In the description below, components similar to those in the embodiments are denoted by the same reference signs and may not be described further in detail.

Modification 1

Figure 9:
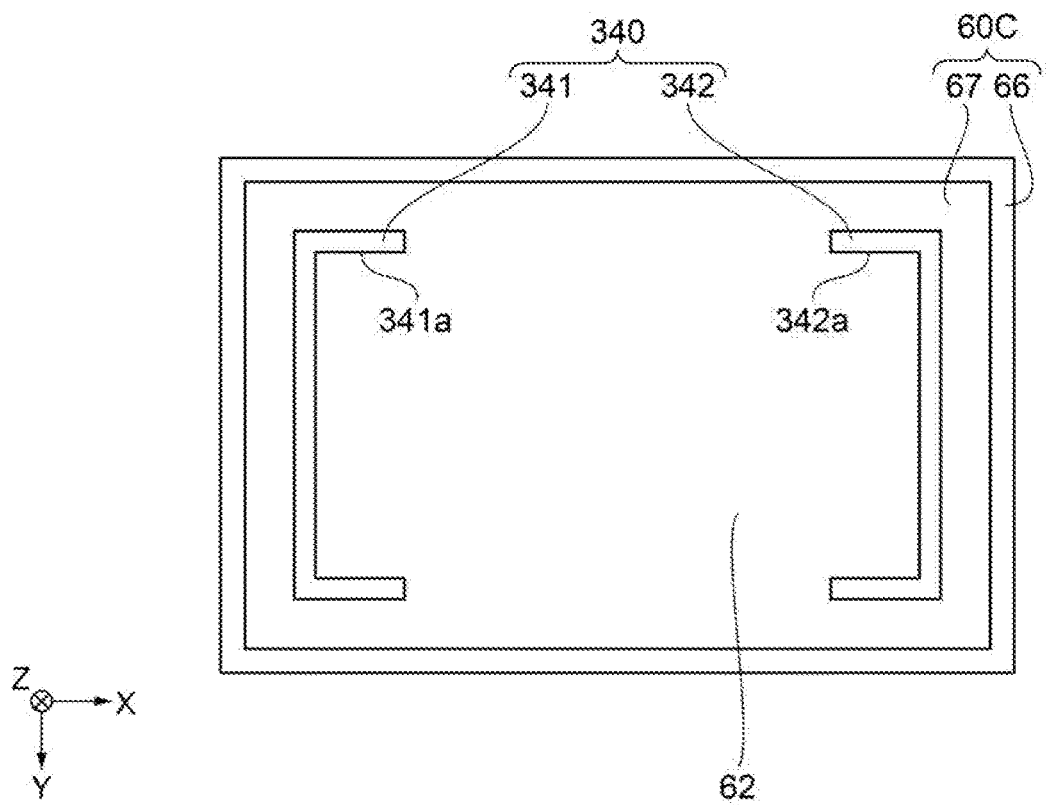
FIG. 9 is a plan view showing modification 1 of an abutting part (lid) and showing a plane equivalent to the plane at the position of C-C' in FIG. 2, as viewed from the substrate side.

First, modification 1 of the abutting part will be described with reference to FIG. 9. FIG. 9 is a plan view showing modification 1 of the abutting part (lid) and showing a plane equivalent to the plane at the position of C-C' in FIG. 2, as viewed from the substrate side.

An abutting part 340 according to modification 1 is arranged along an outer peripheral part 66 of a lid 60C, protruding from a top plate part 67 of the lid 60C, and with a space from the outer peripheral part 66 as shown in FIG. 9. The abutting part 340 has a first abutting part 341 and a second abutting part 342 formed by eliminating center parts of the long sides (two sides along the X-axis) of the abutting part 40, 80, 240 in the shape of a frame (surrounding shape) described in the embodiments and thus dividing the abutting part into two parts. More specifically, the abutting part 340 is made up of the first abutting part 341 and the second abutting part 342, each including a first side extending along the Y-axis and two second sides extending along the X-axis from both ends of the first side and having an open distal end.

The first abutting part 341 and the second abutting part 342 are in the shape of so-called square brackets opening toward the center of the lid 60C and are provided respectively with inner surfaces 341a, 342a functioning as abutting surfaces. That is, when the lid 60C is connected, for example, to the substrate 10 in the first embodiment (see FIGS. 1 and 2), the abutting part 340 is arranged in such a way that the first abutting part 341 and the second abutting part 342 are at positions facing at least apart of the outer edge of the movable member 50 (see FIGS. 1 and 2), in this modification, at positions facing to the four corners of the outer edge of the movable member 50, as viewed in a plan view from the +Z-axis direction. Arranging the abutting part 340 on the lid 60C in this way can securely regulate displacement of the movable member 50 in the in-plane direction including rotational displacement.

The abutting part 340 according to modification 1 can achieve effects similar to those of the first to third embodiments. That is, the impact on the movable member 50 coming into contact with the abutting part 340 can be reduced. Therefore, damage to the movable member 50 and damage to the abutting part 340 can be reduced.

Modification 2

Figure 10:
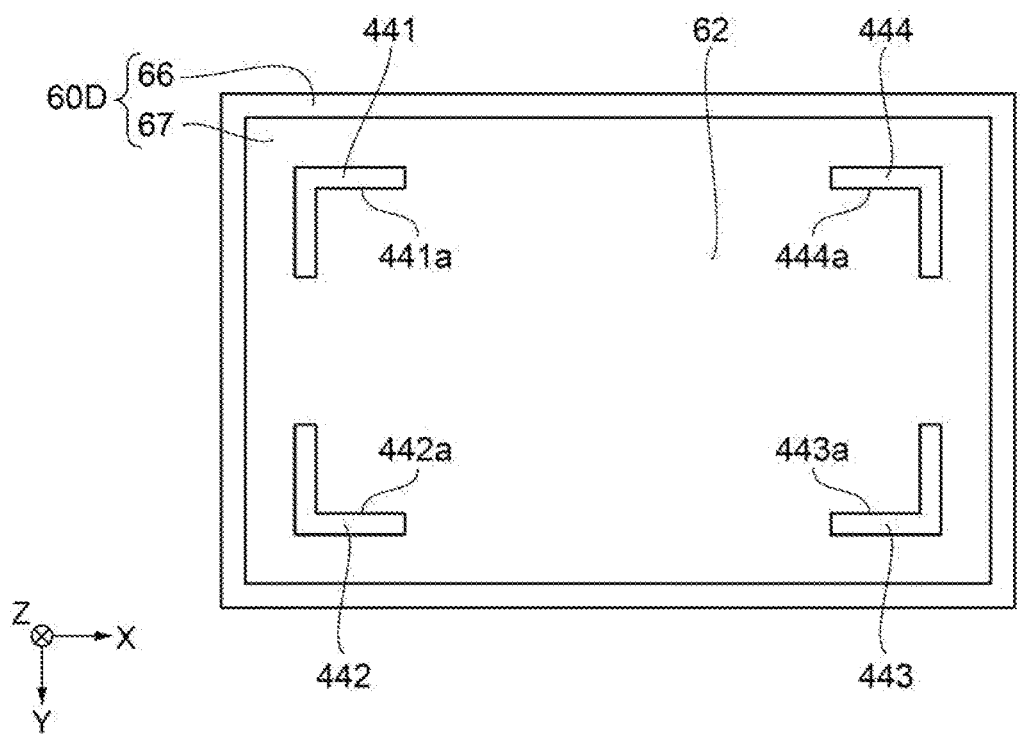
FIG. 10 is a plan view showing modification 2 of the abutting part (lid) and showing a plane equivalent to the plane at the position of C-C' in FIG. 2, as viewed from the substrate side.

Next, modification 2 of the abutting part will be described with reference to FIG. 10. FIG. 10 is a plan view showing modification 2 of the abutting part (lid) and showing a plane equivalent to the plane at the position of C-C' in FIG. 2, as viewed from the substrate side.

The abutting part according to modification 2 is arranged along an outer peripheral part 66 of a lid 60D, protruding from a top plate part 67 of the lid 60D, and with a space from the outer peripheral part 66 as shown in FIG. 10. The abutting part according to modification 2 is made up of a first abutting part 441, a second abutting part 442, a third abutting part 443, and a fourth abutting part 444 formed by eliminating center parts of the long sides (two sides along the X-axis) and the short sides (two side along the Y-axis) of the abutting part 40, 80, 240 in the shape of a frame (surrounding shape) described in the embodiments and thus dividing the abutting part into four parts. More specifically, the abutting part according to modification 2 is arranged in the four corners of the abutting part 40, 80, 240 in the shape of a frame (surrounding shape) described in the embodiments. The first abutting part 441 is arranged in the corner in the −X and −Y-axis direction. The second abutting part 442 is arranged in the corner in the −X and +Y-axis direction. The third abutting part 443 is arranged in the corner in the +X and +Y-axis direction. The fourth abutting part 444 is arranged in the corner in the +X and −Y-axis direction.

The first abutting part 441, the second abutting part 442, the third abutting part 443, and the fourth abutting part 444 are in a so-called L-shape including a first side extending along the Y-axis and having an open distal end and a second side extending along the X-axis form one end of the first side and having an open distal end, and are provided respectively with inner surfaces 441a, 442a, 443a, 444a functioning as abutting surfaces. That is, when the lid 60D is connected, for example, to the substrate 10 in the first embodiment (see FIGS. 1 and 2), the abutting part is arranged in such a way that the first abutting part 441, the second abutting part 442, the third abutting part 443, and the fourth abutting part 444 are at positions facing at least a part of the outer edge of the movable member 50 (see FIGS. 1 and 2), in this modification, at positions facing to the four corners of the outer edge of the movable member 50, as viewed in a plan view from the +Z-axis direction. Arranging the plurality of abutting parts (first abutting part 441, second abutting part 442, third abutting part 443, and fourth abutting part 444) on the lid 60D in this way can securely regulate displacement of the movable member in the in-plane direction including rotational displacement.

The abutting part according to modification 2 can achieve effects similar to those of the first to third embodiments. That is, the impact on the movable member 50 coming into contact with the abutting part (first abutting part 441, second abutting part 442, third abutting part 443, and fourth abutting part 444) can be reduced. Therefore, damage to the movable member 50 and damage to the abutting part (first abutting part 441, second abutting part 442, third abutting part 443, and fourth abutting part 444) can be reduced.

Modification 3

Figure 11:
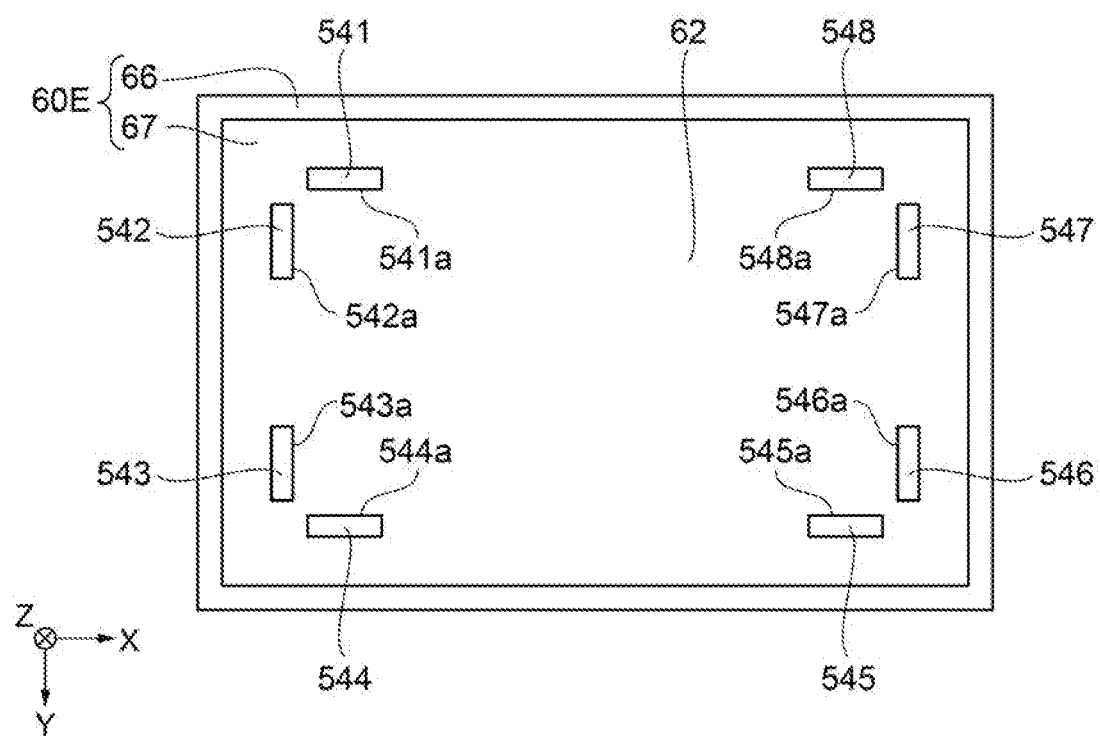
FIG. 11 is a plan view showing modification 3 of the abutting part (lid) and showing a plane equivalent to the plane at the position of C-C' in FIG. 2, as viewed from the substrate side.

Next, modification 3 of the abutting part will be described with reference to FIG. 11. FIG. 11 is a plan view showing modification 3 of the abutting part (lid) and showing a plane equivalent to the plane at the position of C-C' in FIG. 2, as viewed from the substrate side.

The abutting part according to modification 3 is arranged along an outer peripheral part 66 of a lid 60E, protruding from a top plate part 67 of the lid 60E, and with a space from the outer peripheral part 66 as shown in FIG. 11. The abutting part according to modification 3 is made up of eight straight parts formed by eliminating the part of intersection (corner part) between the first side and the second side of each of the first abutting part 441, the second abutting part 442, the third abutting part 443, and the fourth abutting part 444 described in modification 2 and thus dividing into two parts. More specifically, the abutting part according to modification 3 is made up of a first abutting part 541, a second abutting part 542, a third abutting part 543, a fourth abutting part 544, a fifth abutting part 545, a sixth abutting part 546, a seventh abutting part 547, and an eighth abutting part 548 formed by eight straight parts. The abutting part according to modification 3 is arranged in the four corners of the abutting part 40, 80, 240 in the shape of a frame (surrounding shape) described in the embodiments. Specifically, the first abutting part 541 and the second abutting part 542 are arranged in the corner in the −X and −Y-axis direction. The third abutting part 543 and the fourth abutting part 544 are arranged in the corner in the −X and +Y-axis direction. The fifth abutting part 545 and the sixth abutting part 546 are arranged in the corner in the +X and +Y-axis direction. The seventh abutting part 547 and the eighth abutting part 548 are arranged in the corner in the +X and −Y-axis direction.

The first abutting part 541, the second abutting part 542, the third abutting part 543, the fourth abutting part 544, the fifth abutting part 545, the sixth abutting part 546, the seventh abutting part 547, and the eighth abutting part 548 are formed in a linear shape and provided respectively with inner surfaces 541a, 542a, 543a, 544a, 545a, 546a, 547a, 548a functioning as abutting surfaces. That is, when the lid 60E is connected, for example, to the substrate 10 in the first embodiment (see FIGS. 1 and 2), the first abutting part 541, the second abutting part 542, the third abutting part 543, the fourth abutting part 544, the fifth abutting part 545, the sixth abutting part 546, the seventh abutting part 547, and the eighth abutting part 548 are arranged at positions facing at least a part of the outer edge of the movable member 50 (see FIGS. 1 and 2), in this modification, at positions facing to the four corners of the outer edge of the movable member 50, as viewed in a plan view from the +Z-axis direction. Arranging the plurality of abutting parts (first abutting part 541, second abutting part 542, third abutting part 543, fourth abutting part 544, fifth abutting part 545, sixth abutting part 546, seventh abutting part 547, and eighth abutting part 548) on the lid 60E in this way can securely regulate displacement of the movable member 50 in the in-plane direction including rotational displacement.

The abutting part according to modification 3 can achieve effects similar to those of the first to third embodiments. That is, the impact on the movable member 50 coming into contact with the abutting part (first abutting part 541, second abutting part 542, third abutting part 543, fourth abutting part 544, fifth abutting part 545, sixth abutting part 546, seventh abutting part 547, and eighth abutting part 548) can be reduced. Therefore, damage to the movable member 50 and damage to the abutting part (first abutting part 541, second abutting part 542, third abutting part 543, fourth abutting part 544, fifth abutting part 545, sixth abutting part 546, seventh abutting part 547, and eighth abutting part 548) can be reduced.

Inertial Measurement Unit

Figure 12:
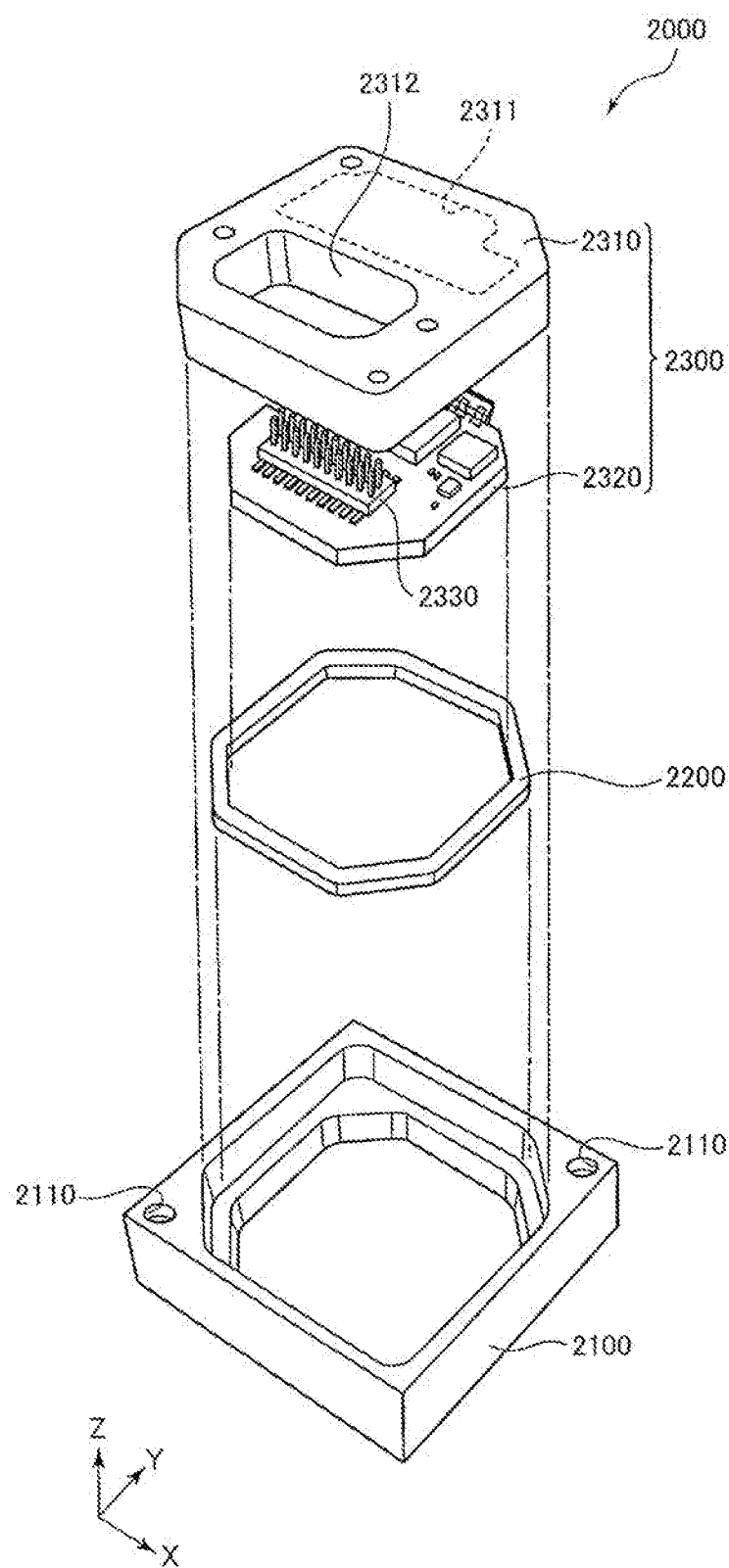
FIG. 12 is an exploded perspective view showing a schematic configuration of an inertial measurement unit.
Figure 13:
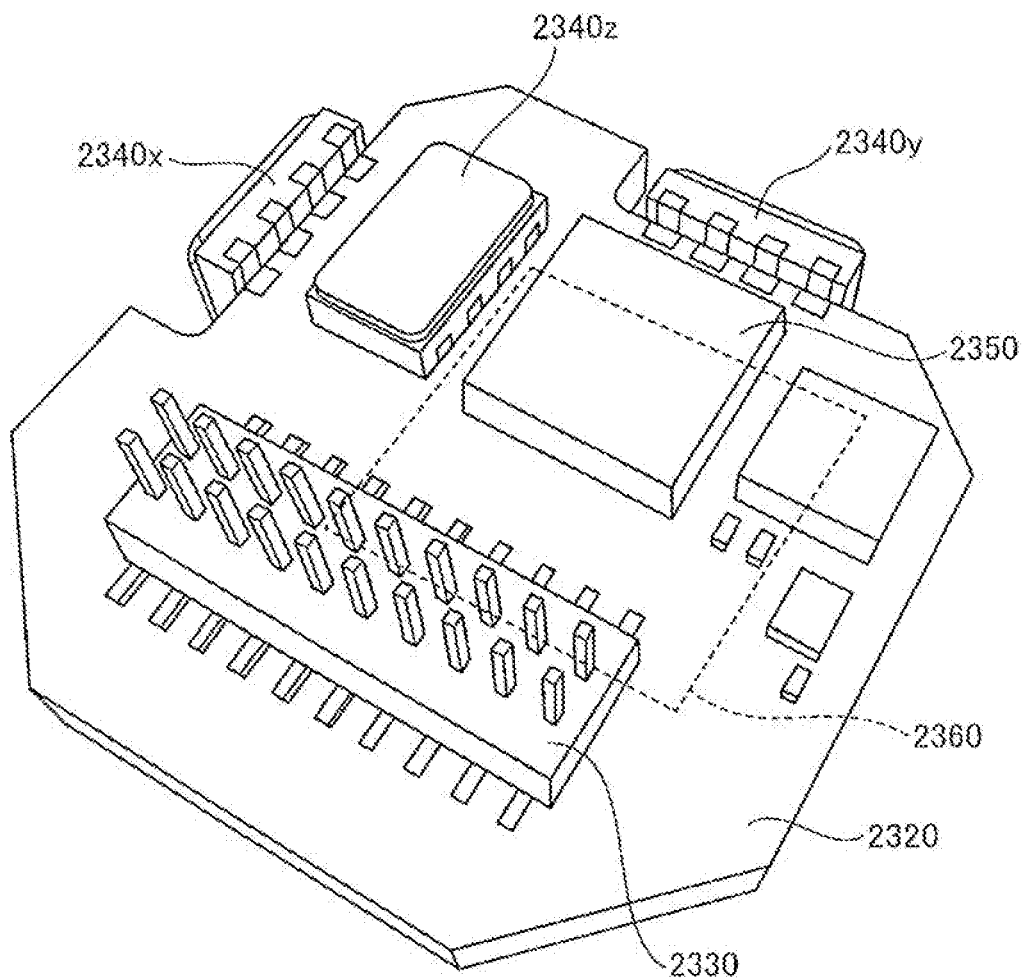
FIG. 13 is a perspective view showing an arrangement example of an inertial sensor element of the inertial measurement unit.

Next, an inertial measurement unit (IMU) will be described with reference to FIGS. 12 and 13. FIG. 12 is an exploded perspective showing a schematic configuration of the inertial measurement unit. FIG. 13 is a perspective view showing an arrangement example of an inertial sensor element of the inertial measurement unit.

An inertial measurement unit 2000 (IMU) shown in FIG. 12 is a device which detects an attitude and behavior (amount of inertial motion) of a moving body (installation target device) such as an automobile or robot. The inertial measurement unit 2000 functions as a so-called 6-axis motion sensor having an acceleration sensor for three axes and an angular velocity sensor for three axes.

The inertial measurement unit 2000 is a rectangular parallelepiped which is substantially square as viewed in a plan view. Near two vertices situated in a diagonal direction of the square, screw holes 2110 as fixing parts are formed. Two screws can be inserted into the two screw holes 2110, thus fixing the inertial measurement unit 2000 onto an installation target surface of an installation target object such as an automobile. Properly selecting components or changing design makes it possible to miniaturize the inertial measurement unit 2000 into a size that can be installed, for example, on a smartphone or digital camera.

The inertial measurement unit 2000 has an outer case 2100, a joining member 2200, and a sensor module 2300. The sensor module 2300 is inserted in the outer case 2100 via the joining member 2200. The sensor module 2300 has an inner case 2310 and a substrate 2320.

The outer shape of the outer case 2100 is a rectangular parallelepiped which is substantially square as viewed in a plan view, similarly to the overall shape of the inertial measurement unit 2000. The screw holes 2110 are formed near two vertices in a diagonal direction of the square. The outer case 2100 is in the shape of a box, with the sensor module 2300 accommodated inside.

The inner case 2310 is a member supporting the substrate 2320 and has a shape to fit inside the outer case 2100. In the inner case 2310, a recessed part 2311 for preventing contact with the substrate 2320 and an opening 2312 for exposing a connector 2330, described later, are formed. Such an inner case 2310 is joined to the outer case 2100 via the joining member 2200 (for example, a packing impregnated with an adhesive). The substrate 2320 is joined to a lower surface of the inner case 2310 via an adhesive.

As shown in FIG. 13, on an upper surface of the substrate 2320, components such as the connector 2330, an angular velocity sensor 2340z which detects angular velocity about the Z-axis, and an acceleration sensor 2350 which detects acceleration in each of the X-axis, Y-axis, and Z-axis directions, are installed. On lateral surfaces of the substrate 2320, an angular velocity sensor 2340x which detects angular velocity about the X-axis, and an angular velocity sensor 2340y which detects angular velocity about the Y-axis are installed. The angular velocity sensors 2340z, 2340x, 2340y are not particularly limited and can be vibration gyro sensors using Coriolis force. The acceleration sensor 2350 is not particularly limited and can be an electrostatic acceleration sensor such as the foregoing MEMS device 1.

On a lower surface of the substrate 2320, a control IC 2360 is installed. The control IC 2360 is a MCU (micro controller unit) and has a storage unit including a non-volatile memory and an A/D converter or the like built inside. The control IC 2360 thus controls each part of the inertial measurement unit 2000. In the storage unit, a program prescribing an order and content for detecting acceleration and angular velocity, a program for digitizing and incorporating detection data into packet data, and accompanying data and the like are stored. In addition to these components, a plurality of other electronic components a installed on the substrate 2320.

The inertial measurement unit 2000 (inertial measurement unit) has been described above. Such an inertial measurement unit 2000 includes the angular velocity sensors 2340z, 2340x, 2340y, the acceleration sensor 2350, and the control IC 2360 (control circuit) for controlling driving of the sensors 2340z, 2340x, 2340y, 2350. Thus, the inertial measurement unit 2000 can achieve the effects of the foregoing MEMS device 1 and can realize high reliability.

Vehicle Positioning Device

Figure 14:
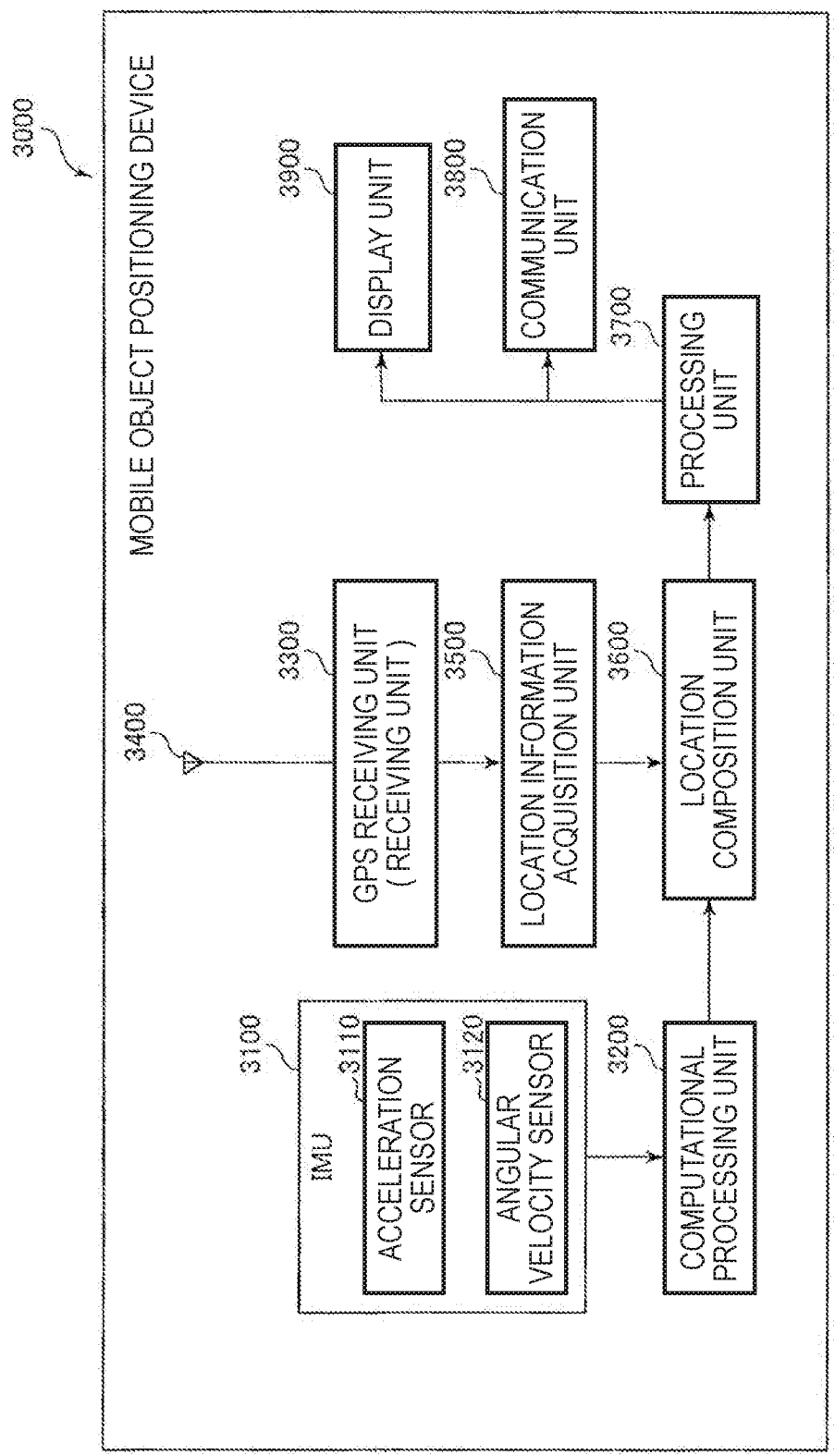
FIG. 14 is a block diagram showing an overall system of a vehicle positioning device.
Figure 15:
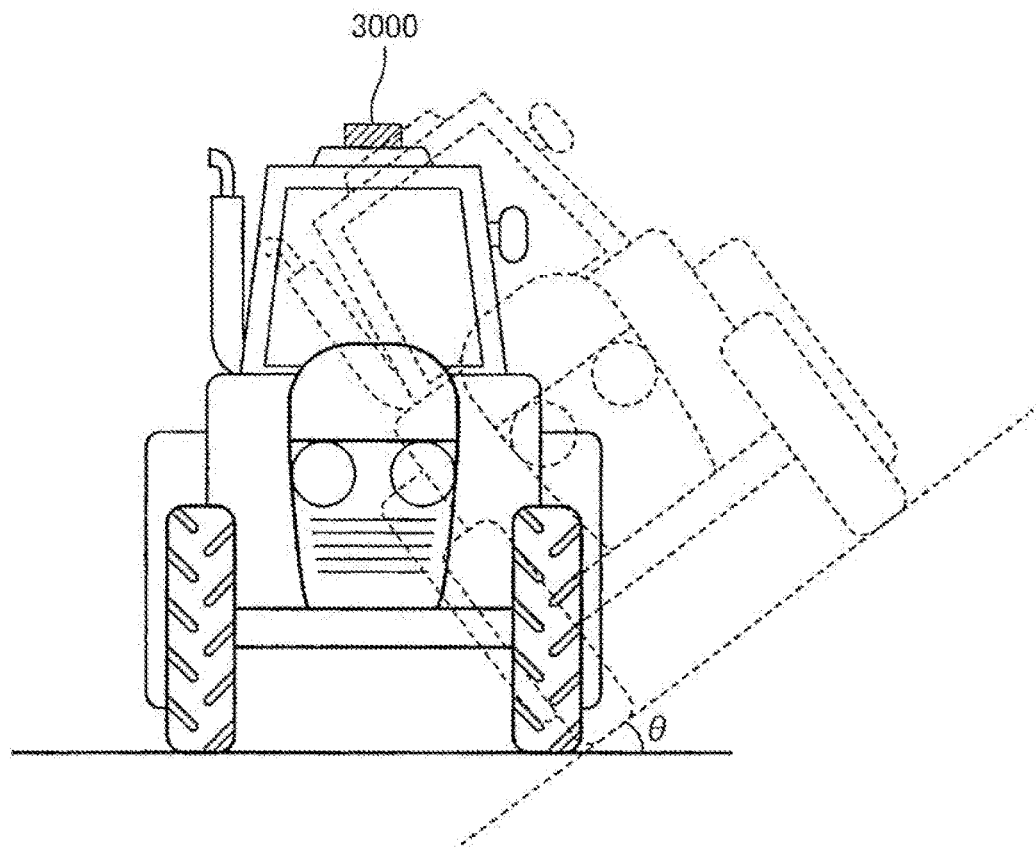
FIG. 15 schematically shows operations of the vehicle positioning device.

Next, a vehicle positioning device will be described with reference to FIGS. 14 and 15. FIG. 14 is a block diagram showing the overall system of the vehicle positioning device. FIG. 15 schematically shows operations of the vehicle positioning device.

A vehicle positioning device 3000 shown in FIG. 14 is a device which is installed and used on a vehicle in order to position the vehicle. The vehicle is not particularly limited and may be any of bicycle, automobile (including four-wheeled automobile and motorcycle), train, airplane, ship, and the like. In this embodiment, a four-wheeled automobile is employed. The vehicle positioning device 3000 has an inertial measurement unit 3100 (IMU), a computational processing unit 3200, a GPS receiving unit 3300, a receiving antenna 3400, a location information acquisition unit 3500, a location composition unit 3600, a processing unit 3700, a communication unit 3800, and a display unit 3900. As the inertial measurement unit 3100, for example, the foregoing inertial measurement unit 2000 can be used.

The inertial measurement unit 3100 has an acceleration sensor 3110 for three axes and an angular velocity sensor 3120 for three axes. The computational processing unit 3200 receives acceleration data from the acceleration sensor 3110 and angular velocity data from the angular velocity sensor 3120, carries out inertial navigation processing of these data, and outputs inertial navigation positioning data (data including the acceleration and attitude of the vehicle).

The GPS receiving unit 3300 receives signals (GPS carrier waves; satellite signals with location information superimposed thereon) from GPS satellites via the receiving antenna 3400. The location information acquisition unit 3500 outputs GPS positioning data representing the location (latitude, longitude, altitude), velocity, and direction of the vehicle positioning device 3000 (vehicle), based on the signals received by the GPS receiving unit 3300. The GPS positioning data also includes status data representing the receiving state, the time of reception, and the like.

The location composition unit 3600 calculates the location of the vehicle, specifically, which location on the ground the vehicle is travelling in, based on the inertial navigation positioning data outputted from the computational processing unit 3200 and the GPS positioning data outputted from the location information acquisition unit 3500. For example, even when the location of the vehicle included in the GPS positioning data is the same, if the attitude of vehicle is different due to the influence of the slope or the like on the ground, as shown in FIG. 15, the vehicle is regarded as traveling at a different location on the ground. Therefore, it is not possible to calculate the accurate location of the vehicle, simply based on the GPS positioning data. Thus, the location composition unit 3600 calculates which location on the ground the vehicle is traveling in, using the inertial navigation positioning data (particularly data about the attitude of the vehicle). This calculation can be carried out relatively easily, using a triangular function (gradient θ from the vertical direction).

The location data outputted from the location composition unit 3600 is processed in a predetermined manner by the processing unit 3700 and the processed location data is displayed as the result of positioning on the display unit 3900. The location data may also be transmitted to an external device by the communication unit 3800.

The vehicle positioning device 3000 has been described above. As described above, such a vehicle positioning device 3000 includes: the inertial measurement unit 3100; the GPS receiving unit 3300 (receiving unit), which receives satellite signals with location information superimposed thereon from positioning satellites; the location information acquisition unit 3500 (acquisition unit), which acquires the location information of the GPS receiving unit 3300, based on the received satellite signals; the computational processing unit 3200 (computing unit), which computes the attitude of the vehicle, based on inertial navigation positioning data (inertial data) outputted from the inertial measurement unit 3100; and the location composition unit 3600 (calculating unit), which corrects the location information based on the calculated attitude and thus calculates the location of the vehicle. Thus, the vehicle positioning device 3000 can achieve the effects of the foregoing MEMS device 1 (inertial measurement unit 2000) and can realize high reliability.

Portable Electronic Apparatus

Next, a portable electronic apparatus using the MEMS device 1 will be described in detail with reference to FIGS. 16 and 17. As an example of the portable electronic apparatus, a wristwatch-type activity tracker (active tracker) will be described below.

Figure 16:
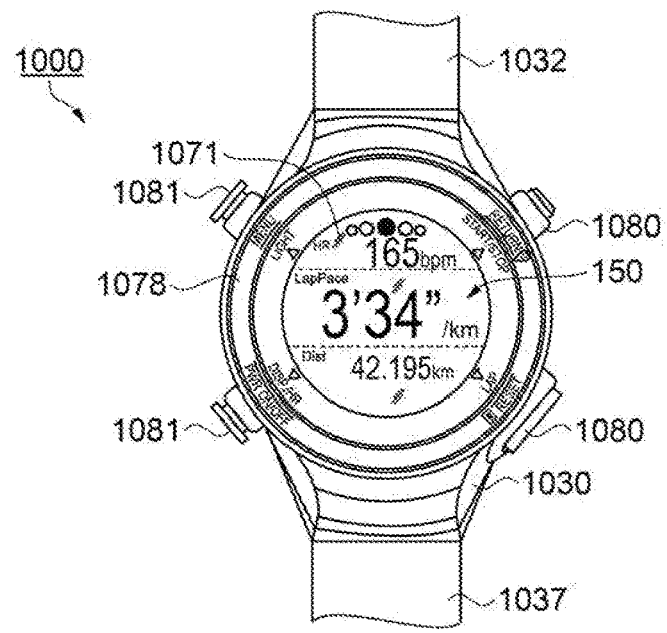
FIG. 16 is a plan view schematically showing the configuration of a portable electronic apparatus.
Figure 17:
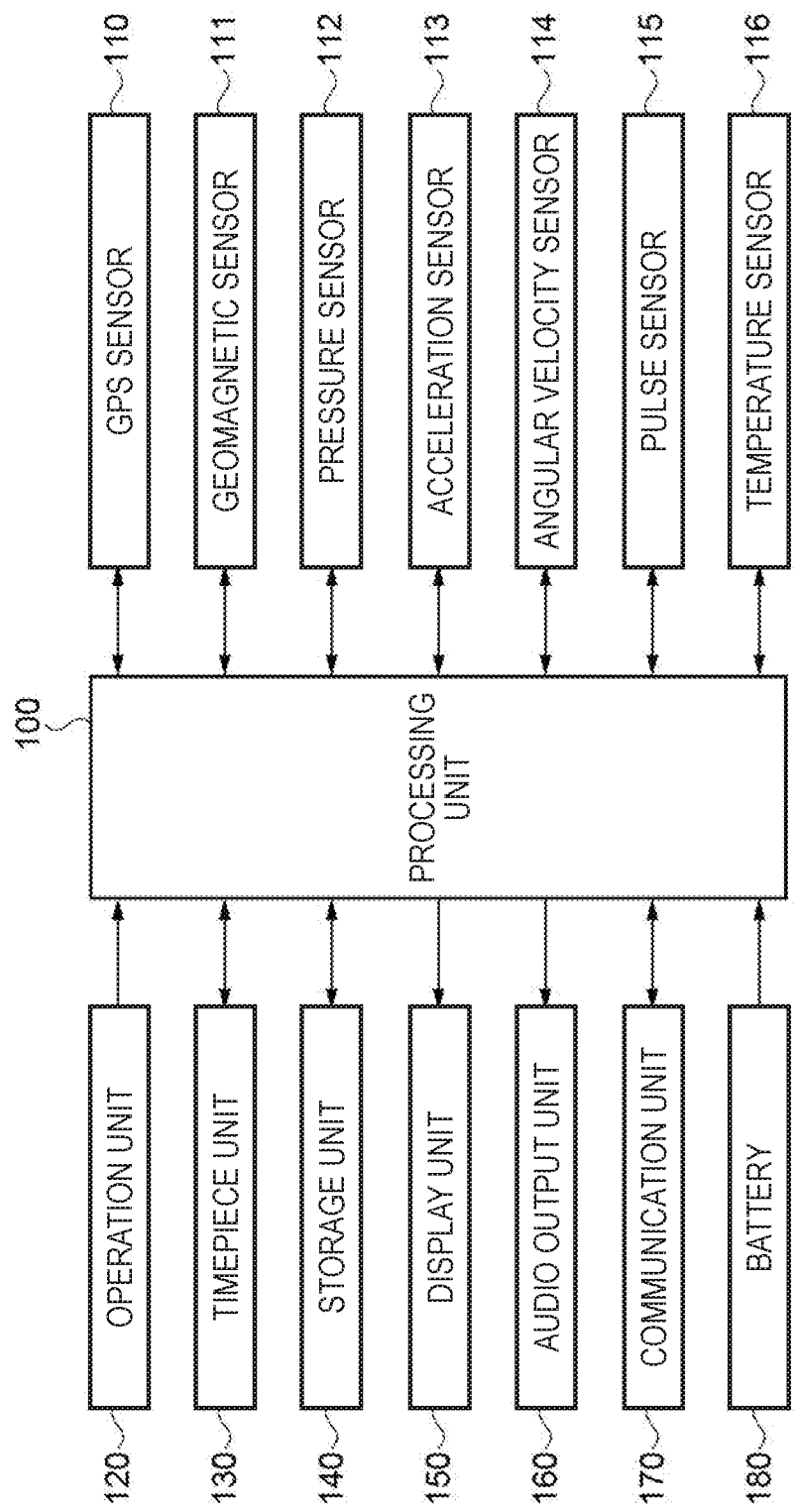
FIG. 17 is a functional block diagram showing a schematic configuration of the portable electronic apparatus.

A wrist device 1000, which is a wristwatch-type activity tracker (active tracker), is installed at a site (subject) such as user's wrist with straps 1032, 1037, as shown in FIG. 16. The wrist device 1000 has a digital display unit 150 and can communicate wirelessly. The foregoing MEMS device 1 according to an embodiment of the invention is incorporated in the wrist device 1000, together with a sensor which measures angular velocity as a sensor for measuring acceleration.

The wrist device 1000 has a case 1030 which accommodates at least the MEMS device 1, a processing unit 100 (see FIG. 17) which is accommodated in the case 1030 and processes output data from the MEMS device 1, a display unit 150 accommodated in the case 1030, and a light-transmissive cover 1071 closing the opening of the case 1030. A bezel 1078 is provided on the outer side of the case 1030 of the light-transmissive cover 1071. On the lateral side of the case 1030, a plurality of operation buttons 1080, 1081 are provided. The wrist device 1000 will now be described further in detail, also with reference to FIG. 17.

An acceleration sensor 113 as the MEMS device 1 detects acceleration in each of three axial directions intersecting each other (ideally, orthogonal to each other) and outputs a signal (acceleration signal) corresponding to the magnitude and direction of the detected accelerations on the three axes. An angular velocity sensor 114 detects angular velocity in each of three axial directions intersecting each other (ideally, orthogonal to each other) and outputs a signal (angular velocity signal) corresponding to the magnitude and direction of the detected angular velocities on the three axes.

A liquid crystal display (LCD) forming the display unit 150 can display, for example, location information using a GPS sensor 110 and a geomagnetic sensor 111, motion information such as the amount of movement or the amount of motion using the acceleration sensor 113 (MEMS device 1) or the angular velocity sensor 114 or the like, biological information such as pulse rate using a pulse sensor 115 or the like, or time information such as the current time, according to various detection modes. The display unit 150 can also display ambient temperature using a temperature sensor 116.

A communication unit 170 carries out various kinds of control to establish communication between the user terminal and an information terminal, not illustrate. The communication unit 170 includes a transmitter/receiver conforming to a short-range wireless communication standard such as Bluetooth (trademark registered) (including BTLE (Bluetooth Low Energy)), Wi-Fi (trademark registered) (Wireless Fidelity), Zigbee (trademark registered), NFC (Near Field Communication), or ANT+ (trademark registered), and a connector conforming to a communication bus standard such as USB (Universal Serial Bus).

The processing unit 100 (processor) is made up of, for example, a MPU (micro processing unit), DSP (digital signal processor), ASIC (application specific integrated circuit), or the like. The processing unit 100 executes various kinds of processing, based on a program stored in a storage unit 140 and a signal inputted from an operation unit 120 (for example, operation buttons 1080, 1081). The processing by the processing unit 100 includes data processing on an output signal from each of the GPS sensor 110, the geomagnetic sensor 111, a pressure sensor 112, the acceleration sensor 113, the angular velocity sensor 114, the pulse sensor 115, the temperature sensor 116, and a timepiece unit 130, display processing of causing the display unit 150 to display an image, audio output processing of causing an audio output unit 160 to output a sound, communication processing of communicating with an information terminal via the communication unit 170, and power control processing of supplying electric power from a battery 180 to each part, or the like.

Such a wrist device 1000 can have at least the following functions.
1. Distance: to measure the total distance from the start of measurement by highly accurate GPS functions.
2. Pace: to display the current traveling pace, based on apace distance measurement value.
3. Average speed: to calculate and display the average speed from the start of traveling to the present.
4. Elevation above sea level: to measure and display the elevation above sea level by GPS functions.
5. Stride: to measure and display the stride even in a tunnel or the like which GPS radio waves do not reach.
6. Pitch: to measure and display the number of steps taken per minute.
7. Heart rate: to measure and display heart rate by the pulse sensor.
8. Gradient: to measure and display the gradient of the ground in training in mountains or trail running.
9. Auto lap: to automatically measure laps when the user runs a predetermined distance or for a predetermined time that is set in advance.
10. Calories burned by exercise: to display calories burned.
11. Numbers of steps taken: to display the total number of steps taken from the start of exercise.

The wrist device 1000 can be broadly applied to various watches such as running watch, runner's watch, runner's watch for multiple sports including duathlon and triathlon, outdoor watch, and satellite positioning system watch such as GPS watch equipped with GPS.

While GPS (Global Positioning System) is used as the satellite positioning system in the above description, other global navigation satellite systems (GNSS) may also be used. For example, one, or two or more of satellite positioning systems such as EGNOS (European Geostationary-Satellite Navigation Overlay Service), QZSS (Quasi Zenith Satellite System), GLONASS (Global Navigation Satellite System), GALILEO, and BeiDou (BeiDou Navigation Satellite System) may be used. Also, as at least one of satellite positioning systems, a stationary satellite-based augmentation system (SBAS) such as WAAS (Wide Area Augmentation System) or EGNOS (European Geostationary-Satellite Navigation Overlay Service) may be used.

Such a portable electronic apparatus has the MEMS device 1 and the processing unit 100 and is therefore very reliable.

Electronic Apparatus

Next, an electronic apparatus using the MEMS device 1 will be described in detail with reference to FIGS. 18 to 20.

First, a mobile personal computer as an example of the electronic apparatus is described with reference to FIG. 18. FIG. 18 is a perspective view schematically showing the configuration of the mobile personal computer as an example of the electronic apparatus.

In this illustration, a personal computer 1100 is made up of a main body section 1104 having a keyboard 1102, and a display unit 1106 having a display section 1108. The display unit 1106 is supported in such a way as to be rotatable about the main body section 1104 via a hinge structure. The MEMS device 1 functioning as an acceleration sensor is built in such a personal computer 1100. Based on detection data from the MEMS device 1, a control unit 1110 can perform control such as attitude control.

Figure 19:
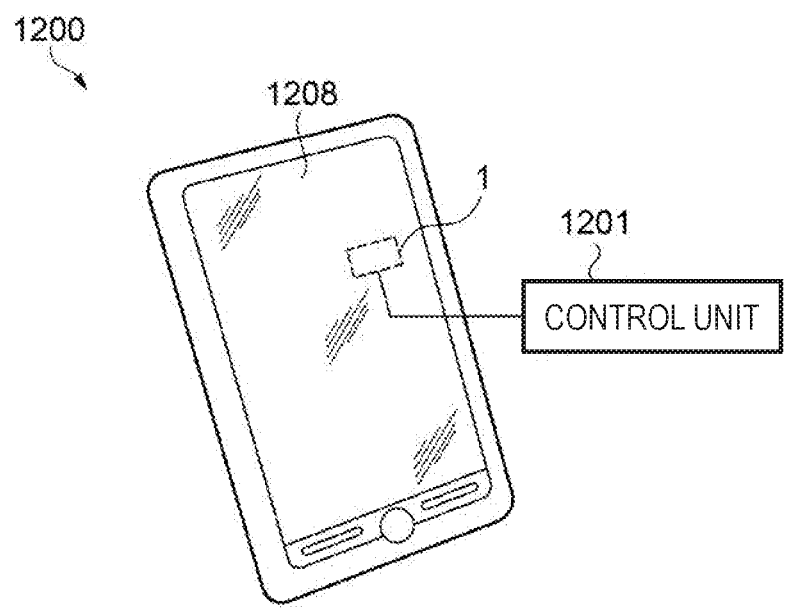
FIG. 19 is a perspective view schematically showing the configuration of a smartphone (mobile phone) as an example of the electronic apparatus.

FIG. 19 is a perspective view schematically showing the configuration of a smartphone (mobile phone) as an example of the electronic apparatus.

In this illustration, the MEMS device 1 is incorporated in a smartphone 1200. Detection data (acceleration data) detected by the MEMS device 1 is transmitted to a control unit 1201 of the smartphone 1200. The control unit 1201 includes a CPU (central processing unit). The control unit 1201 thus can recognize the attitude and behavior of the smartphone 1200, based on the received detection data, and can change a display image displayed on a display unit 1208, output a warning sound or a sound effect, and drive a vibration motor to vibrate the main body. In other words, the control unit 1201 can carry out motion sensing of the smartphone 1200, and change the display content or generate a sound or vibration, based on the measured attitude and behavior. Particularly, when executing a game application, the user can enjoy a sense of reality.

Figure 20:
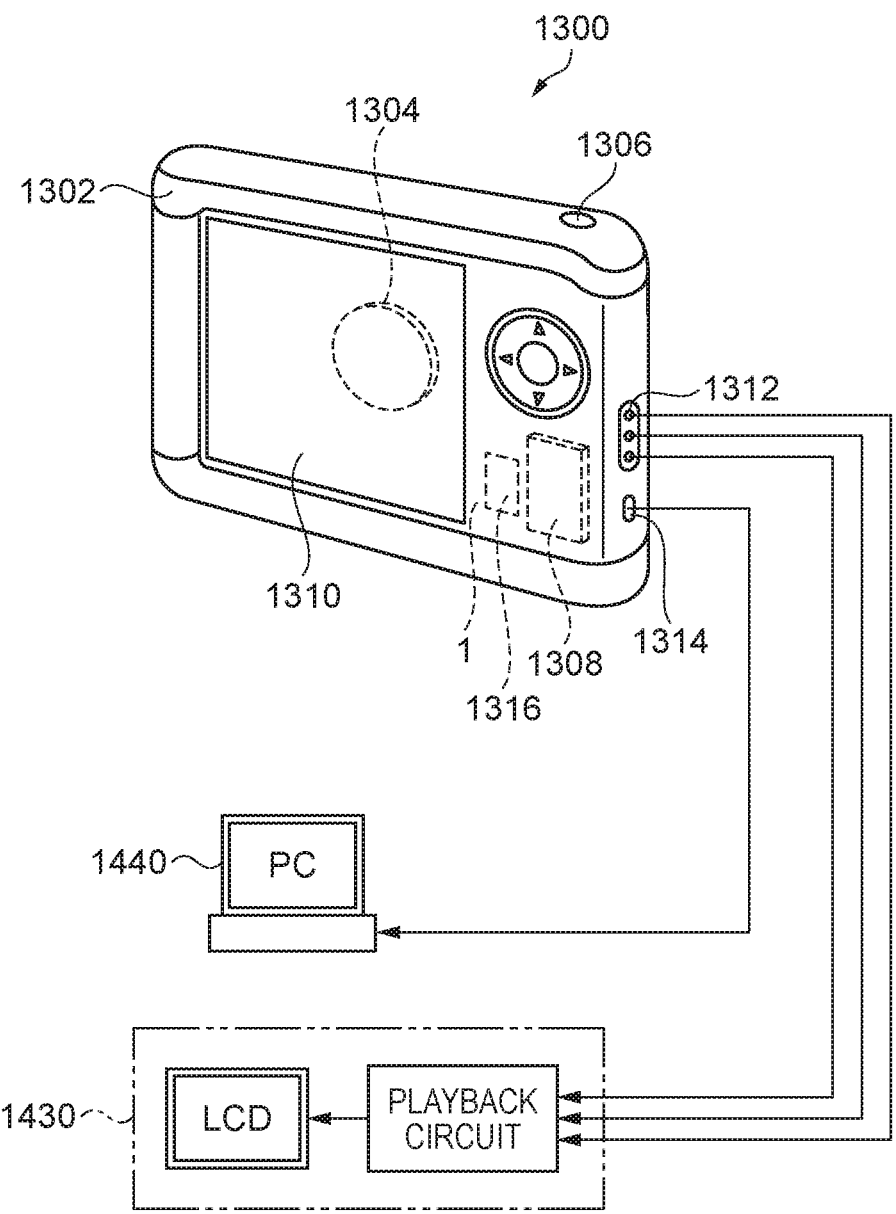
FIG. 20 is a perspective view schematically showing the configuration of a digital still camera as an example of the electronic apparatus.

FIG. 20 is a perspective view showing the configuration of a digital still camera as an example of the electronic apparatus. A connection with an external appliance is simply shown in the illustration.

On the back side of a case (body) 1302 of a digital still camera 1300, a display unit 1310 is provided to display an image based on a picked-up image signal from a CCD. The display unit 1310 also functions as a viewfinder showing a subject as an electronic image. On the front side (back side in the illustration) of the case 1302, a light receiving unit 1304 including an optical lens (image pickup optical system) and a CCD or the like is provided.

The photographer confirms a subject image displayed on the display unit 1310 and presses a shutter button 1306. In response to this, a picked-up image signal from the CCD at that point is transferred to and stored in a memory 1308. On a lateral side of the case 1302 of the digital still camera 1300, a video signal output terminal 1312 and a data communication input/output terminal 1314 are provided. As illustrated, a television monitor 1430 is connected to the video signal output terminal 1312, and a personal computer 1440 is connected to the data communication input/output terminal 1314, according to need. Also, in response to a predetermined operation, the picked-up image signal stored in the memory 1308 is outputted to the television monitor 1430 and the personal computer 1440. The MEMS device 1 functioning as an acceleration sensor is built in such a digital still camera 1300. Based on detection data from the MEMS device 1, a control unit 1316 can perform control such as camera shake correction.

Such an electronic apparatus has the MEMS device 1 and the control unit 1110, 1201, 1316 and is therefore very reliable.

Figure 18:
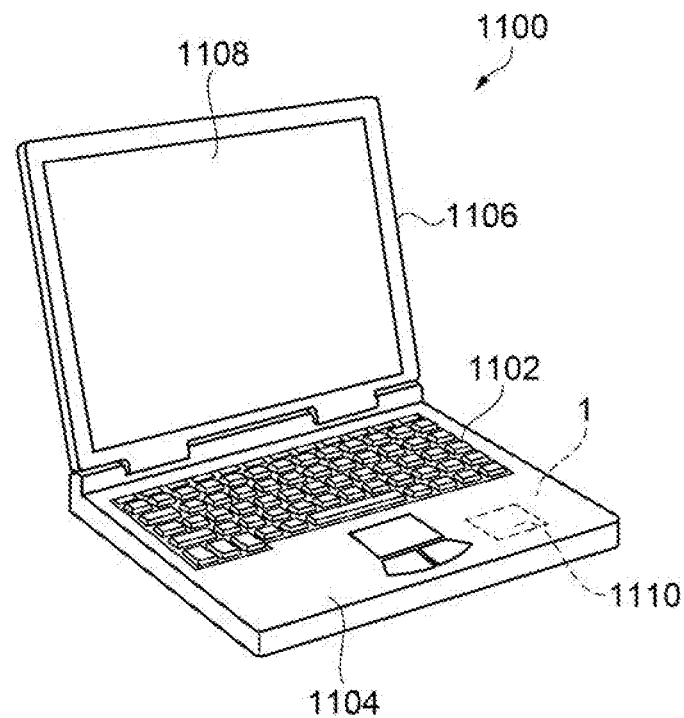
FIG. 18 is a perspective view schematically showing the configuration of a mobile personal computer as an example of an electronic apparatus.

The electronic apparatus having the MEMS device 1 can be applied not only to the personal computer of FIG. 18, the smartphone (mobile phone) of FIG. 19, and the digital still camera of FIG. 20, but also to tablet terminal, timepiece, inkjet ejection device (for example, inkjet printer), laptop personal computer, television, video camera, video tape recorder, car navigation device, pager, electronic organizer (including electronic organizer with communication functions), electronic dictionary, electronic calculator, electronic game device, word processor, workstation, videophone, security monitor, electronic binoculars, POS terminal, medical equipment (for example, electronic body thermometer, blood pressure monitor, blood sugar monitor, electrocardiograph, ultrasonic diagnostic device, electronic endoscope), fishfinder, various measuring devices, instruments (for example, instruments of vehicle, aircraft, ship), flight simulator, seismometer, pedometer, clinometer, vibration gauge which measures vibrations of a hard disk, an attitude control device for a robot or a flying object such as a drone, a control device used for inertial navigation for automatic driving of an automobile, and the like.

Vehicle

Figure 21:
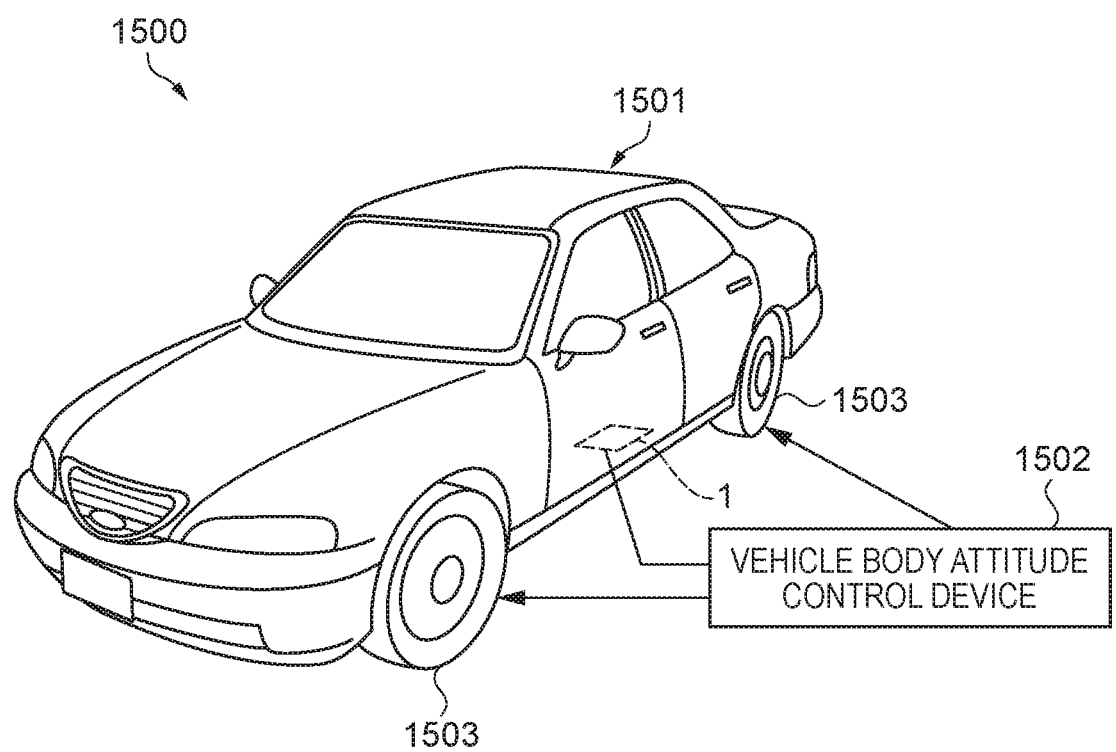
FIG. 21 is a perspective view schematically showing the configuration of an automobile as an example of a vehicle.

Next, a vehicle using the MEMS device 1 is shown in FIG. 21 and described in detail. FIG. 21 is a perspective view showing the configuration of an automobile as an example of the vehicle.

As shown in FIG. 21, the MEMS device 1 is built in an automobile 1500. For example, the MEMS device 1 can detect the attitude of the vehicle body 1501. A detection signal from the MEMS device 1 is supplied to a vehicle body attitude control device 1502 as an attitude control unit which controls the attitude of a vehicle body. Based on the signal, the vehicle body attitude control device 1502 can detect the attitude of a vehicle body 1501 and can control stiffness/softness of suspension or control braking on individual wheels 1503 according to the result of the detection. The MEMS device 1 can also be applied broadly to keyless entry, immobilizer, car navigation system, car air-conditioning, anti-lock braking system (ABS), airbags, tire pressure monitoring system (TPMS), engine control, control device for automatic driving inertial navigation, and electronic control unit (ECU) such as battery monitor for hybrid car or electric vehicle.

The MEMS device 1 applied to a vehicle can also be applied to, for example, attitude control of a two-legged robot, train or the like, attitude control of remote-controlled or autonomous flying object such as radio-controlled airplane, radio-controlled helicopter, or drone, attitude control of agricultural machinery (farm machine) or construction machinery (building machine), and control of rocket, artificial satellite, ship, AGV (automated guided vehicle), or two-legged robot, in addition to the foregoing examples. As described above, to implement attitude control of various vehicles, the MEMS device 1 and a control unit (not illustrated) for each vehicle are incorporated in each vehicle.

Such a vehicle has the MEMS device 1 and the control unit (for example, vehicle body attitude control device 1502 as the attitude control unit) and is therefore very reliable.

The MEMS device, the inertial measurement unit, the vehicle positioning device, the portable electronic apparatus, the electronic apparatus, and the vehicle have been described above, based on the illustrated embodiments. However, the invention is not limited to these embodiments. The configuration of each part can be replaced by any configuration having similar functions. Also, other arbitrary components may be added to the invention.

In the embodiments, the X-axis, the Y-axis, and the Z-axis are orthogonal to each other. However, these axes are noted limited to being orthogonal to each other, provided that these axes intersect each other. The X-axis may be slightly tilted from the direction of the normal line to the YZ plane. The Y-axis may be slightly tilted from the direction of the normal line to the XZ plane. The Z-axis may be slightly tilted from the direction of the normal line to the XY plane. The term "slightly" refers to such a range that the MEMS device 1 can achieve its effects. The specific angle (numerical value) of the tilt varies depending on the configuration or the like.

What is claimed is:

1. A MEMS device comprising:
a base having a support part and a fixed electrode;
a movable member supported on the support part with a main surface facing the fixed electrode; and
a lid joined to the base and forming an accommodation space in which the movable member is accommodated,
wherein the lid has an abutting part which faces, via a space, an outer edge of the movable member regulates displacement in an in-plane direction of the main surface, and
wherein the abutting part is formed integrally with the lid.

2. The MEMS device according to claim 1, wherein the abutting part is provided facing the outer edge of the movable member situated at least in one of a first axis which forms the main surface of the movable member and a second axis which intersects the first axis.

3. The MEMS device according to claim 2, wherein the abutting part is provided facing a corner part of the movable member.

4. The MEMS device according to claim 2, wherein the abutting part is provided in the shape of a frame along the outer edge of the movable member.

5. The MEMS device according to claim 1, wherein the abutting part is provided in a plural number.

6. The MEMS device according to claim 1, wherein the lid has a recessed part forming the accommodation space, and
the abutting part protrudes into the recessed part from the lid.

7. The MEMS device according to claim 1, wherein the movable member is provided with a cavity part,
a fixed part and a suspension part extending from the fixed part are provided in the cavity part, where the movable member is viewed in a plan view, and
the movable member is suspended via the suspension part on the fixed part fixed to the support part.

8. The MEMS device according to claim 1, wherein the movable member and the abutting part are made of a same material.

9. The MEMS device according to claim 8, wherein the abutting part and the movable member have a same electric potential.

10. An inertial measurement unit comprising:
the MEMS device according to claim 1; and
a control circuit which controls driving of the MEMS device.

11. An inertial measurement unit comprising:
the MEMS device according to claim 2; and
a control circuit which controls driving of the MEMS device.

12. A vehicle positioning device comprising:
the inertial measurement unit according to claim 10;
a receiving unit which receives a satellite signal with location information superimposed thereon, from a positioning satellite;
an acquisition unit which acquires location information of the receiving unit, based on the received satellite signal;

a computing unit which computes an attitude of a vehicle, based on inertial data outputted from the inertial measurement unit; and
a calculating unit which corrects the location information, based on the calculated attitude, and thus calculates a location of the vehicle.

13. A vehicle positioning device comprising:
the inertial measurement unit according to claim 11;
a receiving unit which receives a satellite signal with location information superimposed thereon, from a positioning satellite;
an acquisition unit which acquires location information of the receiving unit, based on the received satellite signal;
a computing unit which computes an attitude of a vehicle, based on inertial data outputted from the inertial measurement unit; and
a calculating unit which corrects the location information, based on the calculated attitude, and thus calculates a location of the vehicle.

14. A portable electronic apparatus comprising:
the MEMS device according to claim 1;
a case which accommodates the MEMS device;
a processing unit which is accommodated in the case and processes output data from the MEMS device;
a display unit accommodated in the case; and
a light-transmissive cover which closes an opening of the case.

15. A portable electronic apparatus comprising:
the MEMS device according to claim 2;
a case which accommodates the MEMS device;
a processing unit which is accommodated in the case and processes output data from the MEMS device;
a display unit accommodated in the case; and
a light-transmissive cover which closes an opening of the case.

16. An electronic apparatus comprising:
the MEMS device according to claim 1; and
a control unit which performs control based on a detection signal outputted from the MEMS device.

17. An electronic apparatus comprising:
the MEMS device according to claim 2; and
a control unit which performs control based on a detection signal outputted from the MEMS device.

18. A vehicle comprising:
the MEMS device according to claim 1; and
an attitude control unit which controls attitude, based on a detection signal outputted from the MEMS device.

19. A vehicle comprising:
the MEMS device according to claim 2; and
an attitude control unit which controls attitude, based on a detection signal outputted from the MEMS device.

* * * * *